United States Patent
Goux et al.

(10) Patent No.: US 8,232,174 B2
(45) Date of Patent: Jul. 31, 2012

(54) METHOD FOR CONTROLLED FORMATION OF THE RESISTIVE SWITCHING MATERIAL IN A RESISTIVE SWITCHING DEVICE AND DEVICE OBTAINED THEREOF

(75) Inventors: Ludovic Goux, Hannut (BE); Dirk Wouters, Heverlee (BE)

(73) Assignees: NXP B.V., Eindhoven (NL); IMEC, Leuven (BE)

( * ) Notice: Subject to any disclaimer, the term of this patent is extended or adjusted under 35 U.S.C. 154(b) by 36 days.

(21) Appl. No.: 12/439,414

(22) PCT Filed: Aug. 31, 2007

(86) PCT No.: PCT/IB2007/004440
§ 371 (c)(1),
(2), (4) Date: Dec. 1, 2009

(87) PCT Pub. No.: WO2008/078197
PCT Pub. Date: Jul. 3, 2008

(65) Prior Publication Data
US 2010/0127233 A1    May 27, 2010

Related U.S. Application Data

(60) Provisional application No. 60/841,607, filed on Aug. 31, 2006.

(51) Int. Cl.
*H01L 21/20* (2006.01)
*H01L 21/00* (2006.01)

(52) U.S. Cl. ............... 438/385; 438/104; 257/E21.078

(58) Field of Classification Search ............ 257/43, 257/E21.078; 438/104, 385
See application file for complete search history.

(56) References Cited

U.S. PATENT DOCUMENTS

| 6,815,773 | B2 | 11/2004 | Uehara et al. |
| 2006/0189045 | A1 | 8/2006 | Shum et al. |
| 2006/0263289 | A1* | 11/2006 | Heo et al. .......... 423/447.3 |
| 2007/0194301 | A1 | 8/2007 | Sezi et al. |

FOREIGN PATENT DOCUMENTS

| DE | 10 2005 001902 | 7/2006 |
| GB | 1009837 | 11/1965 |
| WO | 2005/053027 | 6/2005 |

OTHER PUBLICATIONS

Chen, An et al., "Non-Volatile Resistive Switching for Advanced Memory Applications", IEDM 2005, Washington, D.C., Dec. 5-7, 2005.

(Continued)

*Primary Examiner* — Matthew Landau
*Assistant Examiner* — Daniel Luke
(74) *Attorney, Agent, or Firm* — McDonnell Boehnen Hulbert & Berghoff LLP

(57) ABSTRACT

The present disclosure provides a method for controlled formation of the resistive switching layer in a resistive switching device. The method comprises providing a substrate (2) comprising the bottom electrode (10), providing on the substrate a dielectric layer (4) comprising a recess (7) containing the metal for forming the resistive layer (11), providing on the substrate a dielectric layer (5) comprising an opening (8) exposing the metal of the recess, and forming the resistive layer in the recess and in the opening.

17 Claims, 32 Drawing Sheets

OTHER PUBLICATIONS

Muller, R. et al., "Organic CuTCNQ Non-Volatile Memories for Integration in the CMOS Backend-of-Line: Preparation from Gas/Solid Reaction and Downscaling to an Area of 0.25 2M", Solid-State Electronics 50, 2006; pp. 601-605.

Potember, R.S. et al., "Electrical Switching and Memory Phenomena in CuTCNQ Thin Films", Applied Physics Letter 34(6), Mar. 1979, pp. 405-407.

Fan, Z. et al., "Silver-Tetracyanoquinodimethane (Ag-TCNQ), Nanostructures and Nanodevice", IEEE Transactions on Nanotechnology; 2003, pp. 588-591.

Wolf, Stanley, "Silicon Processing for the VLSI Era", vol. 4, 2004, pp. 674-679.

Liu, Qi-Bin et al., "Damascene Array Structure of Phase Change Memory Fabricated with Chemical Mechanical Polishing Method", Chinese Physics Letters; Institute of Physics Publishing, Bristol, GB, vol. 23, No. 8, Aug. 1, 2006, pp. 2296-2298.

PCT International Application Search Report, PCT International Application No. PCT/IB2007/004440 dated Sep. 18, 2008.

* cited by examiner

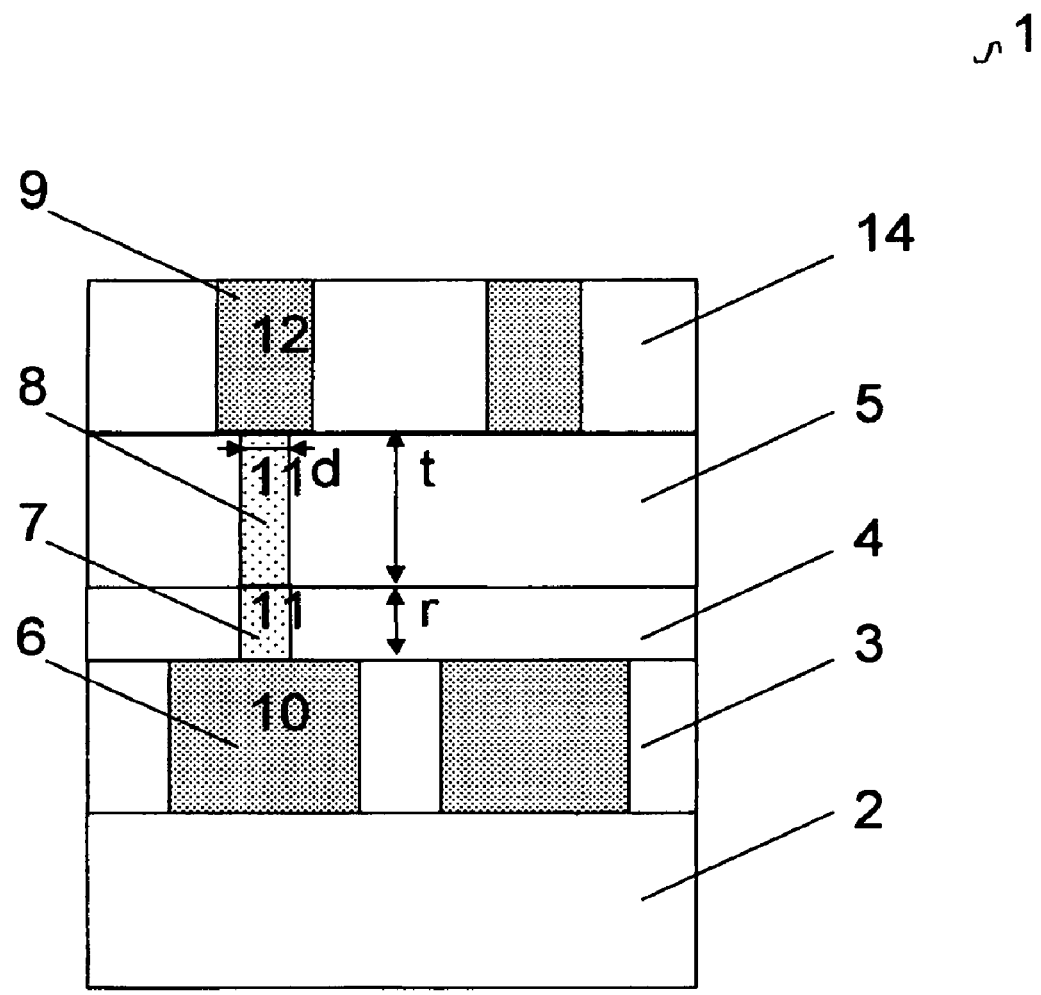

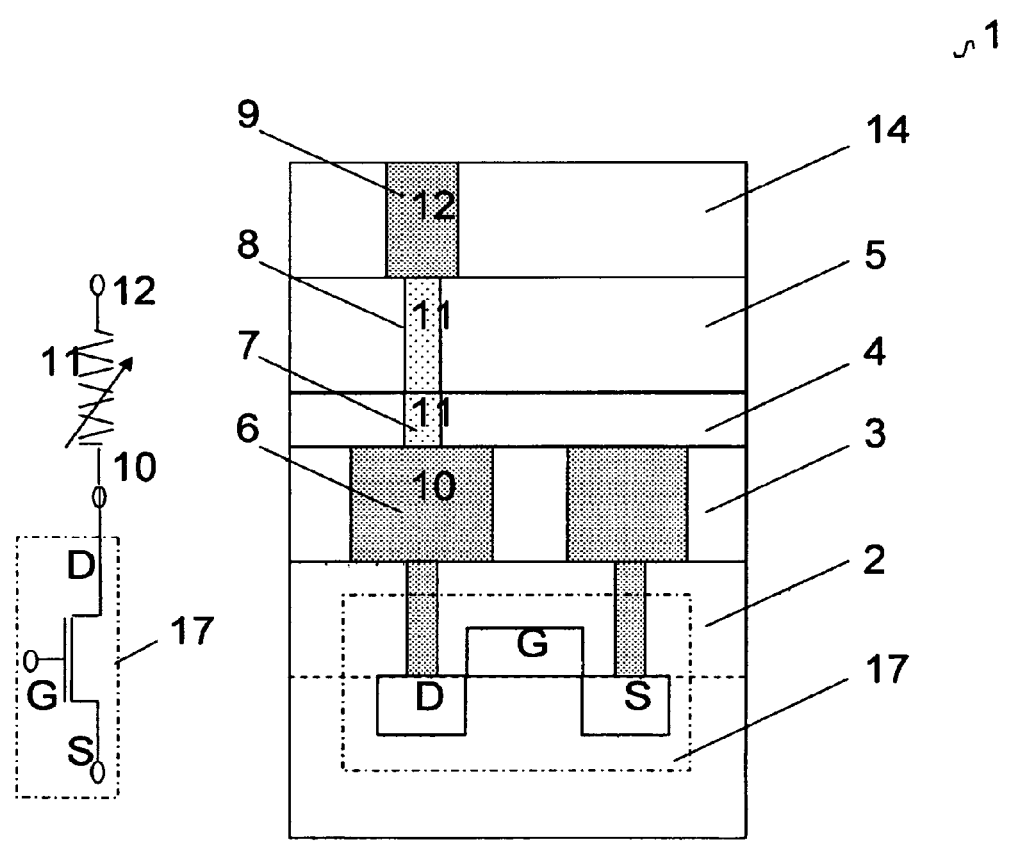

METHOD FOR CONTROLLED FORMATION OF THE RESISTIVE SWITCHING MATERIAL IN A RESISTIVE SWITCHING DEVICE AND DEVICE OBTAINED THEREOF

This application claims the priority of U.S. Provisional Patent Application No. 60/841,607, filed Aug. 31, 2006.

BACKGROUND

The present invention relates to devices wherein the electrical conductivity of the device can be reversibly changed in response to an electrical voltage applied over the device. In particular the invention relates to memory devices comprising organometallic materials as resistive switching material.

The evolution of the market of data storage memories indicates a growing need for ever-larger capacity ranging from gigabytes to hundreds of gigabytes or even to Terabytes. This evolution is driven, amongst others, by new data consuming applications such as multimedia and gaming. The Flash memory technology, wherein the shift in threshold voltage of a field effect transistor is indicative of the bit status, has so far been able to fulfill this scaling requirement, keeping a reasonable cost per bit. However it is expected that Flash memory technology will face severe scaling problems beyond the 45 nm technology node due to fundamental physical limitations.

Resistive switching memories constitute replacement candidates, as their physical switching mechanisms may not degrade with scaling. This type of memories comprises a resistor element that can be reversibly programmed in a high and low conductive state. Various materials such as transition metal oxides, organic semiconductors or organometallic semiconductors can be used to manufacture such resistor element.

Resistive switching memories are being integrated using structures derived from the 1T/1C (one transistor/one capacitor) concept as used in dynamic RAM. The resistor element, comprising the resistive switching material, is stacked on top of a MOS transistor and accessed through the bit-line. The resistor element is placed between metal lines, typically within the back-end-of-line (BEOL) section of the integrated circuit.

Chen et al. also discloses in "Non-Volatile Resistive Switching for Advanced Memory Applications", IEDM 2005, Washington D.C., 5-7 Dec. 2005, a memory array using $Cu_xO$ as resistive switching material in the resistor elements. The copper oxide is grown from the top of the copper plugs onwards which are used as bottom electrode. The stack of the copper oxide and the top-electrode contact (TE) layer needs to be patterned after forming both layers. As etching may damage the active area of the resistor element, an overlap between the MRM element and the copper plug is needed. This overlap will impact the scaling potential of this concept.

R. Müller et al discloses in "Organic CuTCNQ non-volatile memories for integration in the CMOS backend-of-line: preparation from gas/solid reaction and downscaling to an area of 0.25 $um^2$", Solid-State Electronics 50 (2006) 601-605, a method for manufacturing a CuTCNQ film by corrosion of a Cu substrate by TCNQ vapor a reduced pressure. The process flow established by Müller et al consists of first forming copper islands on an oxide layer. These copper islands will be used as bottom electrode and as starting material for the growth of CuTCNQ. A CuTCNQ film is then formed on the exposed surfaces of these copper islands. Alternatively the copper CuTCNQ was grown on top of Cu filled via's. Finally a top electrode is formed by depositing an alumina layer overlying the copper pattern. This method is applicable to form a cross-bar memory array wherein copper bottom electrodes and alumina top electrodes are formed as parallel lines running in perpendicular directions. Each overlap between a top and bottom electrode constitutes a memory element as here between both electrodes a voltage can be applied over the CuTCNQ film. Although the process flow presented by Müller et al is made compatible with CMOS backend-of-line processing, the resistor element formed suffers from the fact that the resistive switching layer is formed in an uncontrolled way. The author tried to limit the growth of the CuTNCQ by decreasing the reaction time and temperature, but in vain.

If the growth of the resistive switching material can not be adequately controlled over the whole substrate, then the thickness of the resistive switching layer will vary from one resistor element to another.

Hence there is a need for a method to form a resistor element comprising a resistive switching layer, in particular an organic or organometallic semiconductor, which method does not suffer from the shortcomings of the prior art.

There is a need for a method to form a resistor element comprising an organic or organometallic semiconductor as resistive switching layer allowing controlled formation of the resistive switching layer in a CMOS compatible process flow.

There is a need for a method to form a resistor element comprising an organic or organometallic semiconductor as resistive switching layer whereby the metal of the bottom electrode and the metal for forming the resistive switching material can be different.

There is a need for a method to form a resistor element comprising a resistive switching layer, in particular an organic or organometallic semiconductor, which method allows further scaling of the resistor array.

There is also a need for a method to form a resistor element comprising a resistive switching layer, in particular an organic or organometallic semiconductor, which method allows the integration of the resistor array with means for selecting individual resistor elements and with peripheral electronic circuitry for operating the resistor array.

SUMMARY

In one embodiment of the invention a method is provided for manufacturing a resistive switching device, comprising a bottom electrode, a top electrode and a layer of resistive switching material contacted by the bottom electrode and the top electrode. The method includes providing a substrate comprising the bottom electrode, providing on the substrate a dielectric layer comprising a recess containing the metal for forming the resistive layer, providing on the substrate a dielectric layer comprising an opening exposing the metal of the recess, and forming the resistive layer in the recess and in the opening. The resistive layer forming process can be characterized by an expansion coefficient, and the ratio of the volume of the forming metal to the volume of the opening is selected proportional to this expansion coefficient. Preferably the volume ratio is selected such that, when formed, the exposed surface of the resistive switching layer is below the exposed surface of the dielectric layer comprising the opening.

In an embodiment of the invention a method is disclosed for manufacturing a resistive switching device, comprising a bottom electrode, a top electrode and a layer of resistive switching material contacted by the bottom electrode and the top electrode. The method comprises providing a substrate comprising the bottom electrode, providing on the substrate a dielectric layer comprising a recess containing the metal for forming the resistive layer, depositing a dielectric layer on recess containing dielectric layer, forming a trench in the dielectric layer, forming in the trench an opening exposing the forming metal, and forming the resistive layer in the recess and in the opening. The resistive layer forming process can be characterized by an expansion coefficient, and the ratio of the volume of the forming metal to the volume of the opening is selected proportional to this expansion coefficient. Preferably the volume ratio is selected such that, when formed, the exposed surface of the resistive switching layer is below the exposed surface of the dielectric layer comprising the opening.

In any of the previous embodiments the resistive layer can be formed to at least partially fill the opening with the resistive layer where after the top electrode is formed in the at least partially filled opening.

In an embodiment of the invention a method is disclosed for manufacturing a resistive switching device, comprising a bottom electrode, a top electrode and a layer of resistive switching material contacted by the bottom electrode and the top electrode. The method comprises providing a substrate comprising the bottom electrode, providing on the substrate a dielectric layer comprising a recess containing the metal for forming the resistive layer, forming a dielectric layer comprising and opening exposing the forming metal, forming inside the opening the resistive layer, and forming a dielectric layer comprising a trench exposing the resistive layer, and forming at least in the trench the top electrode. The resistive layer forming process can be characterized by an expansion coefficient and the ratio of the volume of the forming metal to the volume of the opening is selected proportional to this expansion coefficient. Preferably the volume ratio is selected such that, when formed, the exposed surface of the resistive switching layer is below the exposed surface of the dielectric layer comprising the opening.

In an embodiment of the invention a method is disclosed for manufacturing a resistive switching device, comprising a bottom electrode, a top electrode and a layer of resistive switching material contacted by the bottom electrode and the top electrode, the method comprising providing a substrate comprising a first metal pattern, and the bottom electrode is provided in the first metal pattern, providing on the substrate a dielectric layer comprising a recess containing the metal for forming the resistive layer, providing on the substrate a dielectric layer comprising an opening exposing the metal of the recess, and forming the resistive layer in the recess and in the opening. The resistive layer forming process can be characterized by an expansion coefficient and the ratio of the volume of the forming metal to the volume of the opening is selected proportional to this expansion coefficient. Preferably the volume ratio is selected such that, when formed, the exposed surface of the resistive switching layer is below the exposed surface of the dielectric layer comprising the opening.

In an embodiment of the invention, a method is disclosed for manufacturing a resistive switching device, comprising a bottom electrode, a top electrode and a layer of resistive switching material contacted by the bottom electrode and the top electrode, the method comprising providing a substrate comprising a first metal pattern and the bottom electrode is provided in a via contacting the first metal pattern, providing on the substrate a dielectric layer comprising a recess containing the metal for forming the resistive layer, providing on the substrate a dielectric layer comprising an opening exposing the metal of the recess, and forming the resistive layer in the recess and in the opening. The resistive layer forming process can be characterized by an expansion coefficient and the ratio of the volume of the forming metal to the volume of the opening is selected proportional to this expansion coefficient. Preferably the volume ratio is selected such that, when formed, the exposed surface of the resistive switching layer is below the exposed surface of the dielectric layer comprising the opening.

In an embodiment of the invention a resistive switching device is disclosed comprising a bottom electrode, a top electrode and a layer of resistive switching material contacted by the bottom electrode and the top electrode, whereby the top electrode and the resistive layer are contained in an opening formed in a dielectric layer. The resistive switching layer can be formed from a metal other than the metal of the first metal pattern.

In an embodiment of the invention a resistive switching device is disclosed comprising a bottom electrode, a top electrode and a layer of resistive switching material contacted by the bottom electrode and the top electrode, whereby the bottom electrode is formed in a first metal pattern, the top electrode being formed in a second metal pattern, a dielectric layer separates the first and the second metal pattern thereby comprising an opening for providing a connection between the first metal pattern and the second metal pattern, and the resistive layer being contained within the opening. The resistive switching layer can be formed from a metal other than the metal of the first metal pattern.

In any of the embodiments the resistive switching material can be a charge transfer complex containing an electron donor and an electron acceptor. This resistive switching material can be an organic compound having a pi-electron system. The organic compound can be provided by TCNQ or by a derivative of TCNQ, while the electron donor is provided by the forming metal, the metal being selected from the group of Cu, Ag or K.

In any of the embodiments the resistive switching material can be a binary metal oxide.

In any of the embodiments the forming metal and the bottom electrode can be composed of different metals.

In of the embodiments of the invention the resistive switching device is a non-volatile memory device.

BRIEF DESCRIPTION OF THE DRAWINGS

FIGS. 3a-g shows a schematic process flow for the fabrication of a resistive switching memory device according to an embodiment.

FIG. 7 illustrates a resistive switching memory device comprising a transistor as selection element according to embodiments of the invention.

DETAILED DESCRIPTION

Figure 1:
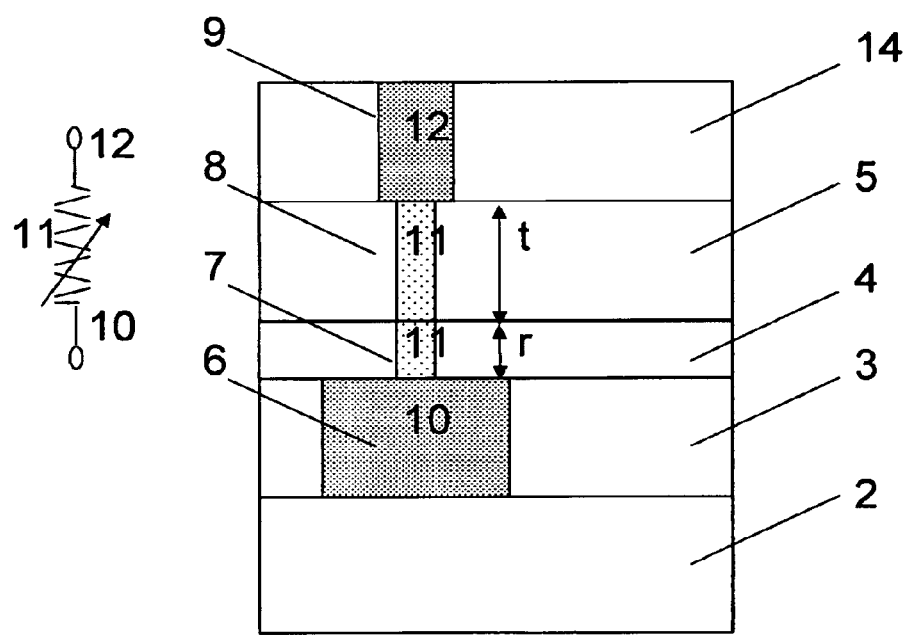
FIG. 1 shows a schematic cross-section of a resistor element according to an embodiment and an electrical symbol.

The present invention will be described with respect to exemplary embodiments and with reference to certain drawings but the invention is not limited. The drawings described are only schematic and are non-limiting. In the drawings, the size of some of the elements may be exaggerated and not drawn on scale for illustrative purposes. Hence the dimensions and the relative dimensions do not necessarily correspond to actual reduction to practice of the invention. It is intended that the embodiments and figures disclosed herein be considered illustrative rather than restrictive.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. Like elements are referred using like numerals.

FIG. 1 shows a schematic cross-section of device 1 comprising a resistor element according to an embodiment. On a substrate 2 a stack is provided comprising multiple dielectric layers 3, 4, 5, 14 in which metallic patterns 6, 9 are embedded at different levels. These metallic patterns 6, 9 are isolated from each-other by intermediate dielectric layers 4, 5. Through these intermediate dielectric layers 4, 5 an opening or via is formed to establish an electrical connection 7, 8 between the metallic patterns 6, 9 or parts thereof which are located at different levels with the dielectric layer stack. Such a structure is known as a damascene interconnect structure because, as will be illustrated by the process flow of FIGS. 2a-f. In these dielectric layers 3, 4, 5, 14 trenches are formed which are then filled with conductive materials. These trenches are then used to form either a metallic pattern or an electrical throughput connecting metallic pattern, also known as via.

Depending on whether interlevel connection 7, 8 and metallic patterns 6, 9 are formed individually or in combination, the respective interconnect structure is denoted as single damascene or dual damascene.

The substrate 2 can be any substrate on which such damascene stack can be formed. Examples of such substrate are a glass or quartz substrate, a ceramic substrate, a semiconductor substrate such as a silicon substrate, a silicon-on-insulator substrate (SOI), a germanium substrate, a germanium-on-insulator substrate (GOI). Preferably this substrate 2 is semiconductor substrate comprising active elements 17 such as diodes, transistors such as field effect transistors or bipolar transistors. The interconnect structure shown in FIG. 1 is then used to establish electrical connections between individual active elements and between active elements and the bonding pads of the integrated device.

In order to make a resistor element one needs a bottom electrode 10, a layer of resistive switching material 11 in contact with the bottom electrode 10 and a top electrode 12 in contact with the resistive switching material 11. In operation a voltage drop is applied over the layer 11 of resistive switching material by applying voltages to respectively the bottom electrode 10 and the top electrode 12. Current will flow from one electrode 10, 12 through the resistive layer to the other electrode 12, 10. According to this embodiment the layer of resistive switching material 11 establish the electrical connection 7, 8 between two metallic patterns 6, 9 or parts thereof. The trench formed in dielectric layers 4, 5 is filled with resistive switching material 11 contacting at one end metallic pattern 6 and on the opposite end metallic pattern 9. The resistive switching material 11 is confined to the trench formed in the intermediate dielectrics 4, 5 and is sandwiched between the dielectric layers 3, 14 containing the metallic patterns 6, 9. Parts of the two metallic patterns 6, 9 are used as respectively the bottom 10 and top 12 electrode of the resistor element. Both electrodes are at least aligned to the electrical connection 7, 8 which comprises the resistive switching material 13. Depending on the dimensions of the trenches formed in dielectric layers 3 and 14 the bottom electrode 10 and/or the top 12 electrode essentially overlaps the electrical connection 7, 8. This situation is illustrated in FIG. 1.

FIGS. 2a-f illustrates by means of schematic cross-sections a process flow for manufacturing the device 1 illustrated by FIG. 1.

A substrate 2 is provided. The substrate 2 can be any substrate on which such damascene stack can be formed. Examples of such a substrate are a glass or quartz substrate, a ceramic substrate, a semiconductor substrate such as a silicon substrate, a silicon-on-insulator substrate (SOI), a germanium substrate, a germanium-on-insulator substrate (GOI). Preferably this substrate 2 is semiconductor substrate comprising active elements such as diodes, transistors such as field effect transistors or bipolar transistors. If the substrate 2 contains active elements, these active elements can be used to select individual resistor elements in an array of resistor elements. Typically an active element, such as a diode or a transistor is operatively linked to a resistor element such that, when in operation, only selected resistor elements are addressed. The selected resistor element is then operated, e.g. programmed, erased or read. If the substrate 2 contains active elements than a dielectric layer is formed overlying the substrate. This dielectric layer isolate the active elements from the interconnect structure which will be formed upon the substrate. This dielectric layer is known as premetal dielectric (PMD).

Figure 2A:
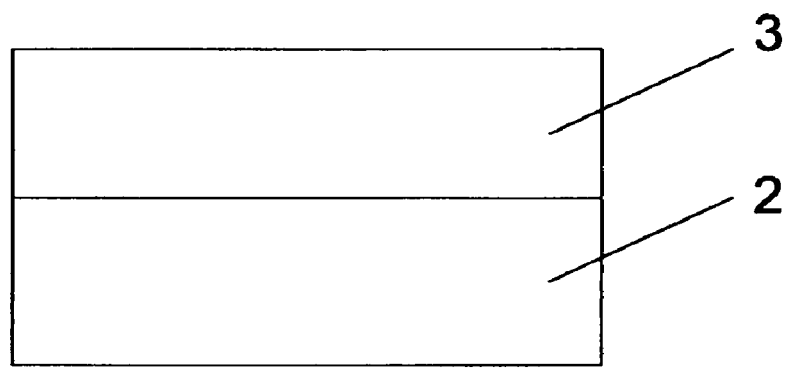
FIGS. 2a-f shows a schematic process flow for the fabrication of a device according to the embodiment illustrated by FIG. 1.

On this substrate 2 a first dielectric layer 3 is present as shown in FIG. 2a. Typically this dielectric layer 3 isolates the substrate 2 from the interconnect structure, in which case this dielectric layer 2 is known as premetal dielectric (PMD). The material of the dielectric layer 3 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating.

Figure 2B:
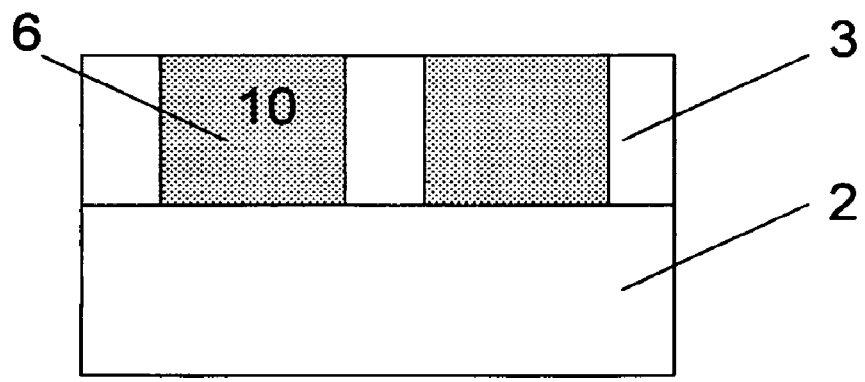

In this dielectric 3 a first metallic pattern 6 is formed as shown in FIG. 2b. Hereto trenches are etched in the dielectric layer 3 in accordance with the pattern and the dimensions of the metallic pattern 6 to be formed. A first metallic layer is deposited overlying the patterned dielectric layer 3. Typically a stack of metallic layers is deposited to at least fill the trenches formed in dielectric layer 3. The material of the metallic pattern 6 can be Cu, Al, W, WN, Ti, TiN, Ta and/or TaN.

Metal in excess of the metal in the filled trenches is removed, e.g. by polishing or etch-back. Typically the substrate 2 is polished such that any metal present outside the trench is removed. One can use e.g. chemical polishing (CP) or chemical-mechanical polishing (CMP). The thus formed metallic pattern 6 provides the bottom or first electrode 10 of the resistor element.

Figure 2C:
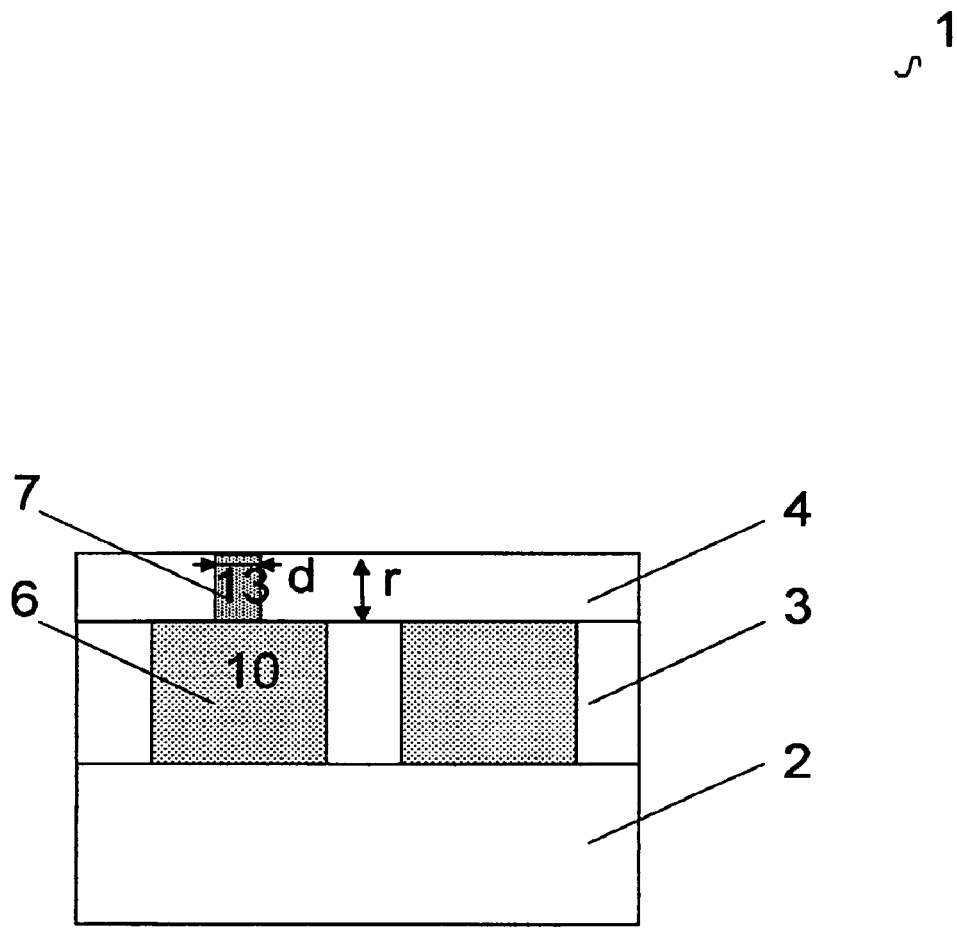

Overlying the first metallic pattern 6 a second dielectric layer 4 is formed as shown in FIG. 2c. In this dielectric layer 4 a recess 7 is created providing access to the first metallic pattern 6. This recess 7 has a height r and a width d. The height r of the recess 7 is determined by the thickness of the second dielectric layer or layer stack 4, while the width d is determined by the lithographic patterning step. The metal 13, selected as starting material for the formation of the resistive switching layer 11 to be formed in later steps, is provided in the recess 7. Preferably this metal is deposited over the substrate 2 and all metal in excess of the recess 7 is removed, e.g. by polishing or etch-back. Typically the substrate 2 is polished such that any metal present outside the recess 7 is removed. One can use e.g. chemical polishing (CP) or chemical-mechanical polishing (CMP). The thus formed metal recess 7 provides the metal 13 for forming the resistive switching layer 11. The metal 13 used to fill the recess 7 can be different than the metal used to form the metallic pattern 6. As the metal for forming the resistive switching layer 11 is only provided by the metal 13 contained in the recess 7 and no longer by the metal of the bottom electrode 10 or by the metal of the underlying metal pattern 6, determining the metal volume 13 will determined the resistive switching layer 11 volume. Once substantially all metal 13 contained within the recess 7 is consumed the resistive switching layer 11 forming process will stop.

Figure 2D:
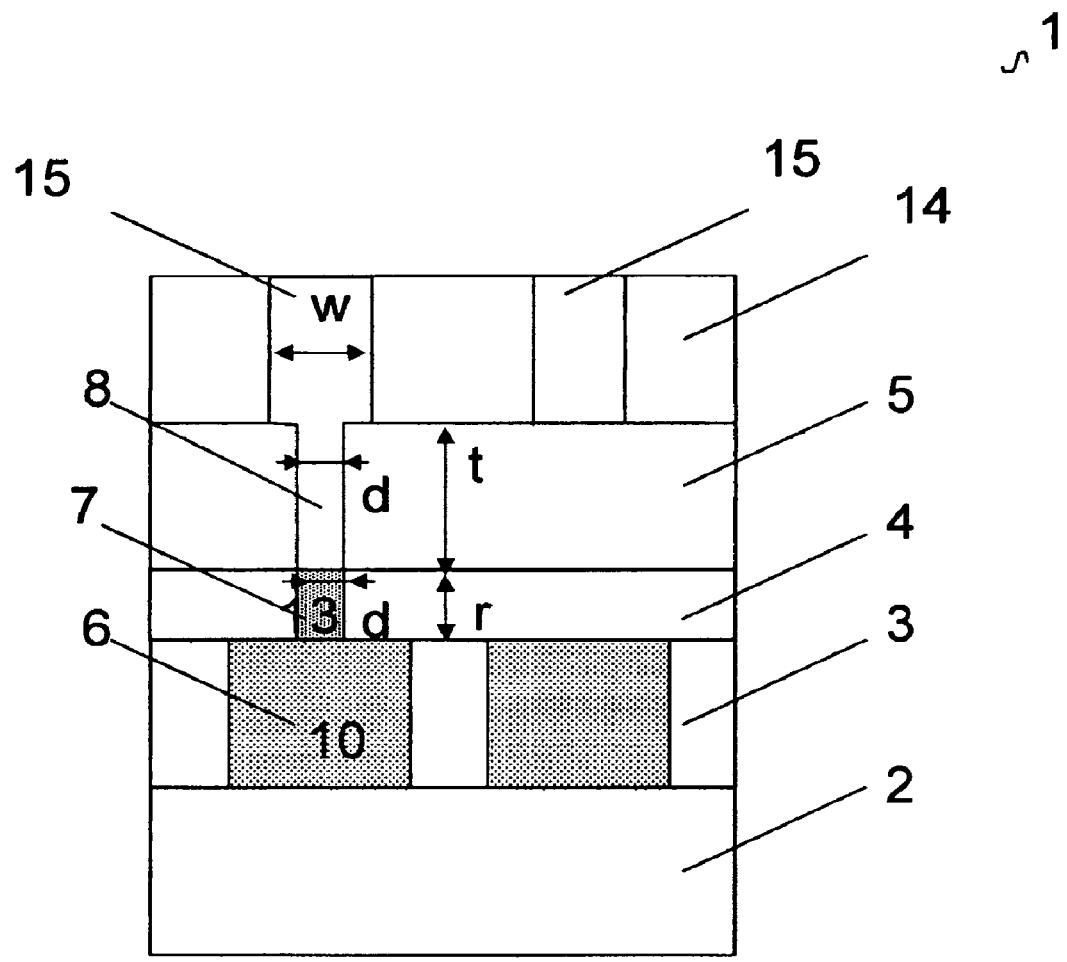

Overlying the dielectric layer 4 containing the metal recess 7 another dielectric layer is formed as shown in FIG. 2d. This third dielectric layer 5 further isolates metallic patterns 6, 9 present at subsequent levels, in which case this dielectric layer is known as intermetal dielectric (IMD). In this dielectric layer cavities 15 are formed in accordance with the pattern and the dimensions of the second metallic pattern 9 to be formed. Where an electrical connection 8 is to be formed between metallic patterns 6, 9 present at subsequent levels, the corresponding cavity 15 is extended 8 to expose the filled metal recess 7 contacting the first metallic pattern 6. The extension 8 can be aligned to the trench 15, in which case the diameter d of trench 8 is of substantially the same magnitude as the width w of the trench 15. The trench 8 can be formed within the trench 15 or within the perimeter of the trench 15, in which as in which case the diameter d of trench 8 is of less than the width w of the trench 15. Typically a stack of dielectric layers 5 is deposited. The trench 15 will be at least aligned to the opening 8 in which case w≧d, or will be overlapping the opening 8 in which case w>d. In each dielectric layer 5, 14 respective trenches 8, 15 are formed. The trench 8 in the dielectric layer 5 adjacent to the recess 7 will constitute a container to which the later formed resistive switching material is confined. The trenches 15 in the layer 14 overlying layer 5 will be filled with metal to form the second metallic pattern 9.

For the purpose of teaching the invention the width w of the trench 15 is made larger than the diameter d of the trench 8 in the embodiment illustrated by FIG. 2d. Typically the trench 8 is made aligned to the trench 15 and the width w of trench 15 is substantially equal to the diameter d of the trench 8 such that the trench 15 does not or only slightly overlaps the trench 8. The material of the dielectric layers 5, 14 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating.

Figure 2E:
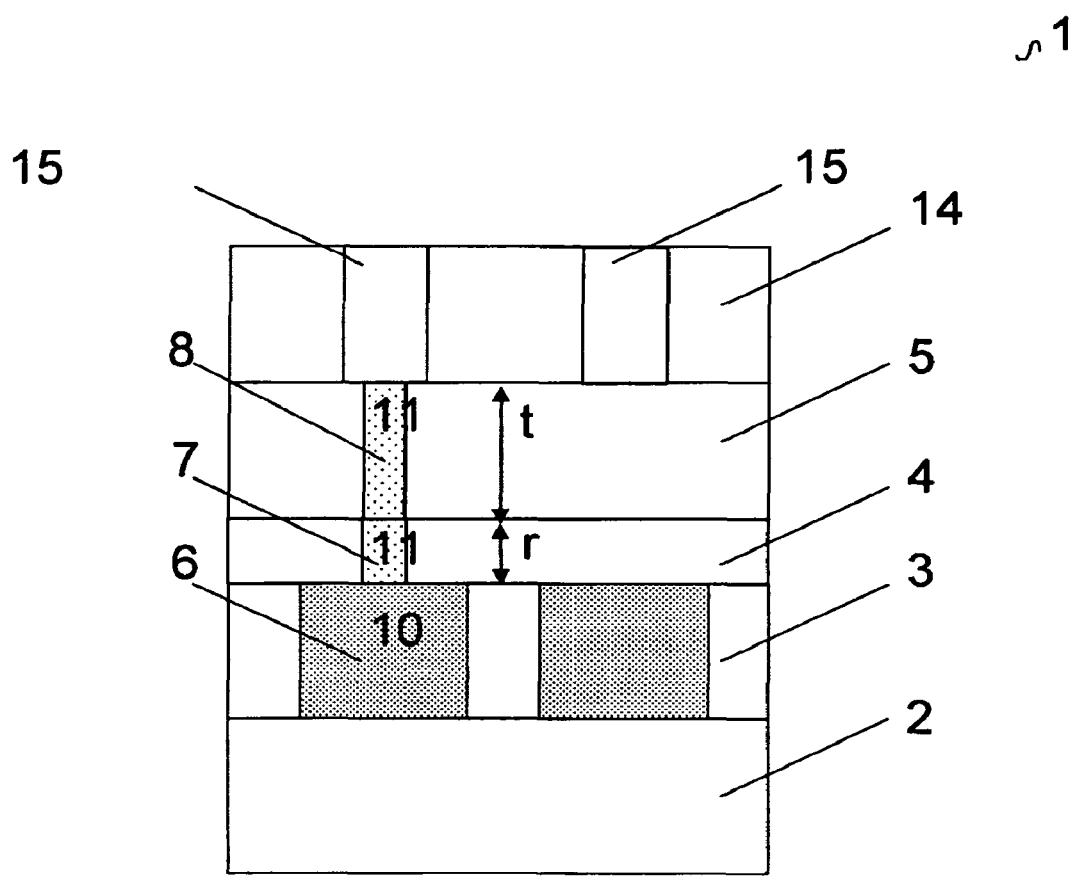

In the trench 8 adjacent to the recess 7 a resistive switching material 11 is selectively formed as shown in FIG. 2e starting from the metal 13 provided in the recess 7. The resistive switching material 22 will at least partially fill this trench 8 and 7. The resistive switching material 11 is confined to the trench 8, 7 such that the resistive switching layer 11 doesn't extend beyond the trench 8. The thickness of the resistive switching layer 11 is thus equal to or less than the height of the trench 8, 7 which height corresponds to the sum of the thickness t of the second dielectric layer 5 and of the thickness r of the first dielectric layer 4. Per unit volume of available metal 13 about 20 times more volume of resistive switching material 11 will be formed during growth. For example if CuTCNQ is formed, the volume of CuTNCQ will be about 20 times the volume of the consumed copper 13. The ratio (volume of trench 8 to recess 7) is selected to substantially correspond to the ratio (volume of resistive switching material 11 formed to volume of metal 13) consumed. If the trench 8 and the recess 7 are lithographically patterned using the same mask, both cavities 7, 8 will have substantially the same cross-section area parallel to the substrate 2. The ratio (the thickness t of the second dielectric layer 5 to the thickness r of the first dielectric layer 4) will then be selected as function of the volume increase of the resistive switching layer 11 formed. In case of CuTCNQ the value of thickness t should be at least 20 times greater than the value of the thickness r.

As the resistive switching layer 11 forming process is characterized by a known volume expansion coefficient, i.e. the ratio of volume of resistive switching material 11 formed to the volume of metal 13 consumed during the forming process, this volume expansion coefficient is used to dimension the recess 7 and the trench 8. If the volume of one of the recess 7 or the trench 8 is selected, the volume of the other of the trench 8 or the recess 7 is determined by using the volume expansion coefficient. In case of nanowire growth, i.e. where a preferential growth occurs in substantially one direction, one can rather use the term growth factor or linear coefficient instead of volume expansion coefficient as in such one dimensional structures the dimension of the trench 8 will depend on the length of the formed resistive switching nanowire 11. In such one dimensional devices the thickness of the metal forming layer 13, which is equal to or less then height r of the dielectric layer 4, will determine the height of the nanowire, the ratio between them being proportional to the growth factor or conversion factor of the resistive switching material forming process. In case of CuTCNQ a Cu layer of 1 nm will result in a nanowire of about 20 nm length. This growth factor will depend on the organometallic material formed such as the stoichiometry of the formed layer.

The resistive switching layer 11 comprises a charge transfer complex containing an electron donor and an electron acceptor. The electron acceptor is formed by an organic compound having a pi electron system. Preferably the organic compound is provided by TCNQ or by a derivative of TCNQ. The electron donor is provided by metal 13 contained in the recess 7. Preferably this metal is Cu, Ag or K. The material of the resistive switching layer 11 is selected from the group of organic materials and organometallic semiconductors: rotaxanes and catenanes, polyphenyleneethylenes, CuDDQ and AgDDQ wherein DDQ standing for 2,3-dichloro-5,6-dicyano-p-benzoquinone, CuTCNE and AgTCNE, wherein TCNE standing for tetracyanoethylene, CuTNAP and AgT-NAP, wherein TNAP standing for tetracyanonaphtoquinodimethane, as well as AgTCNQ and CuTCNQ, wherein TCNQ standing for 7,7,8,8-tetracyano-p-quinodimethane.

Methods for growing organic semiconductors are known in the art. For example in the case of TCNQ, grow methods are e.g. disclosed by R. S. Potember et al in "Electrical switching and memory phenomena in CuTCNQ thin films", Applied Physics Letter 34(6) March 1979, in particular the formation of CuTCNQ by a reaction between metallic copper and TCNQ dissolved in acetonitrile, U.S. Pat. No. 6,815,733 in particular the growth of CuTCNQ by thermal codeposition of Cu and TCNQ on an $Al_2O_3$ layer.

R. Müller et al in "Organic CuTCNQ non-volatile memories for integration in the CMOS backend-of-line: preparation from gas/solid reaction and downscaling to an area of 0.25 $um^2$", Proceedings of ESSDERC conference, Grenoble, France, p 216, in particular growth of CuTCNQ by corrosion of a Cu substrate by TCNQ vapor a reduced pressure, Z Fian et al in "Silver-tetracyanoquinodimethane (Ag-TCNQ) Nanostructures and Nanodevice" in IEEE Transactions on Nanotechnology, vol 4, no 2: 238-14, March 2005, the growth of AgTCNQ either by a reaction between Ag and TCNQ dissolved in acetonitrile or by a synthesis of Ag and TCNQ in a vapor atmosphere Alternatively a bistable resistive switching binary metal oxide 11 can be thermally grown on the exposed metal 13 of recess 7. The binary oxide can be a cuprous oxide $Cu_xO_y$ if copper 13 is used to the fill the recess 7. The binary metal oxide can be a transition metal binary oxide, such as titanium oxide, Depending on the metal exposed an oxide such as an alumina oxide, a tantalum oxide, a titanium oxide or a nickel oxide can be grown.

The metal for forming the resistive switching layer 11 is thus provided by the metal contained in the recess 7. The amount of the metal available for forming the resistive switching layer 11 is function by the dimensions of this recess. Hence the amount of resistive switching layer 11 formed is limited by the dimensions of this recess 7 and not by the process parameters such as time and temperature. Hence the growth of the resistive switching layer 11 can be easier or better controlled by the selecting the geometry of the recess 7. Moreover as the metal 13 contained in recess 7 can be different from the metal used to form the metallic pattern 6, appropriate metals can be selected to fill the recess 7. If instead of Cu another metal 13 is used for forming the resistive switching material 11, these other materials should be selected to be compatible with the damascene process flow including the materials. The metal should adhere to the copper of the bottom contact 10 and be removable using a polishing or etch back process.

If the forming metal 13 is different from the material of the bottom electrode 10 then the reaction will be limited by the amount of forming metal 13 present. If substantially all forming metal 13 is consumed, the reaction will stop. If the bottom electrode 10 comprises a metal that is also used as forming metal 13, then both material systems 10 and 13 need to be separated by a layer 16. Otherwise the resistive switching layer forming process will continue after consuming the forming metal 13 by further consuming the forming metal present in the bottom electrode 13. If Cu is used as bulk material for the bottom electrode 10 and also as forming metal 13, than typically a conductive barrier layer 16 is formed in between both Cu layers. This barrier layer can be a Ti, TiN, Ta, TaN or any combination thereof.

A second metallic layer is deposited overlying the patterned dielectric layer 4, 5 to at least fill the trenches 15 formed in dielectric layer 14. If the trench 8 is not completely filled with the resistive switching material 11, then this second metallic layer will also fill the remainder of the trench 8. Typically a stack of metallic layers is deposited over the patterned dielectric 14. The material deposited can be Cu, Al, W, WN, Ti, TiN, Ta and/or TaN.

Figure 2F:
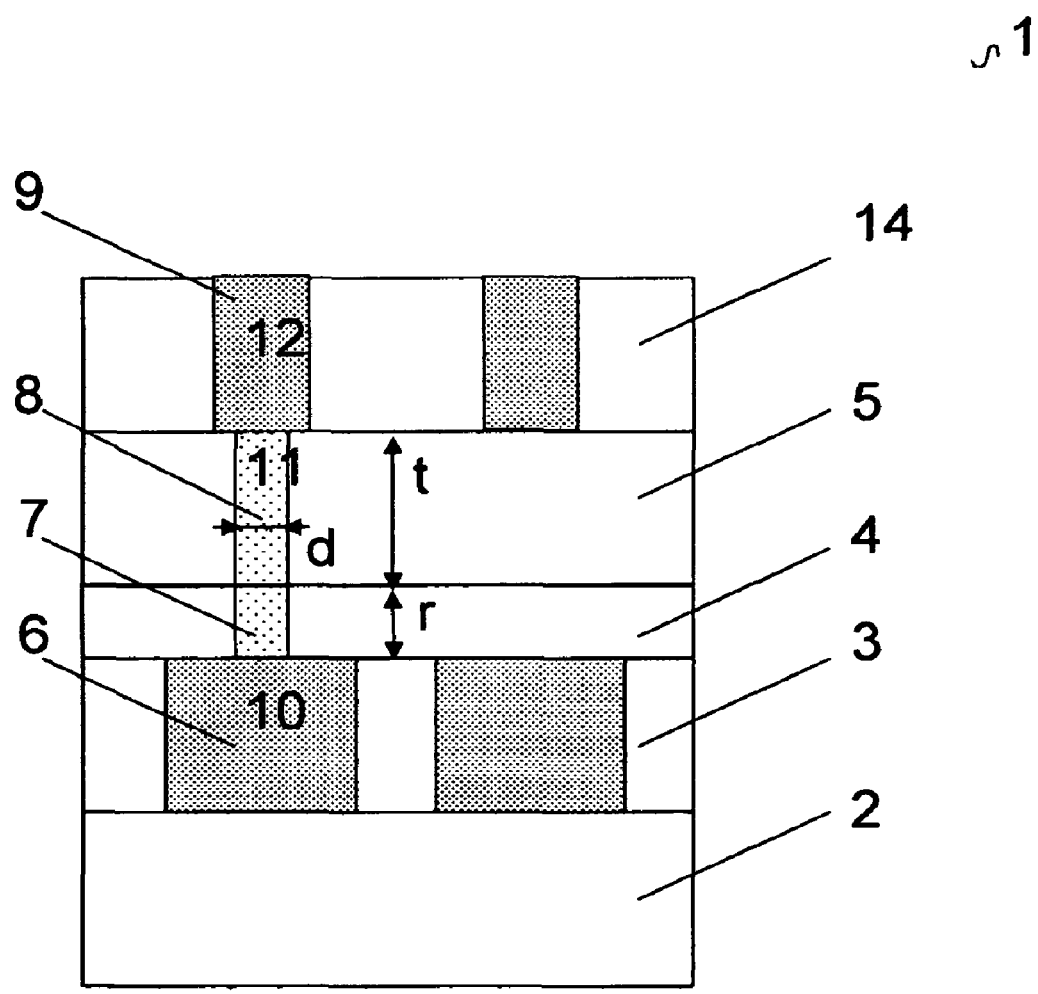

Metal in excess of the filled trenches 15 is removed, e.g. by polishing or etch-back. Typically the substrate 2 is polished such that any metal present outside the trench is removed. One can use e.g. chemical polishing (CP) or chemical-mechanical polishing (CMP). The thus formed second metallic pattern 9 provides the top or second electrode 12 of the resistor element as shown in FIG. 2f. An advantage of the embodiments of the invention is that the resistive switching material 11 doesn't overly the dielectric layer 14. Hence the metal of the top electrode 12 will be deposited directly on this dielectric layer 14 without the metal topography being affected by any residues of resistive switching material 11 being present in-between the dielectric layer 14 and the second metal layer overlying the dielectric layer.

FIGS. 2a-f illustrates a process module for the fabrication of a resistor element according to embodiments of the invention, the resistor element comprising a bottom electrode 10, a resistive switching layer 11 and a top electrode 12. This process module is compatible with damascene processing for fabrication of interconnect structures; in particular interconnect structures fabricated in the back-end-of-line part of semiconductor processing. The resistive switching layer 11 and the top electrode 12 are formed in the via 7, 8 and the trench 15 of a dual damascene interconnect module whereby the resistive switching layer 11 at least partially fills the via 7, 8. The metal for forming the resistive switching layer 11 is provided by the metal 13 in a recess 7 formed in a dielectric layer 4 on top of the bottom electrode 10. An advantage of this process module is that it is independent of other process modules in a process flow and hence can be inserted at various moments in the process flow. By using the available process modules from a CMOS back-end-of-line to manufacture the bottom electrode and the top electrode, the present invention considerably reduces the process complexity when manufacturing a resistive switching device according to any of the embodiments.

FIGS. 3a-e illustrates by means of schematic cross-sections a process flow for manufacturing the device 1 illustrated by FIG. 1.

A substrate 2 is provided. The substrate 2 can be any substrate on which such damascene stack can be formed. Examples of such a substrate are a glass or quartz substrate, a ceramic substrate, a semiconductor substrate such as a silicon substrate, a silicon-on-insulator substrate (SOI), a germanium substrate, a germanium-on-insulator substrate (GOI.) Preferably this substrate 2 is a semiconductor substrate comprising active elements such as diodes, transistors such as field effect transistors or bipolar transistors. If the substrate 2 contains active elements 17, these active elements can be used to select individual resistor elements in an array of resistor elements. Typically an active element, such as a diode or a transistor is operatively linked to a resistor element such that, when in operation, only selected resistor elements are addressed. The selected resistor element is then operated, e.g. programmed, erased or read. If the substrate 2 contains active elements than a dielectric layer is formed overlying the substrate. This dielectric layer isolate the active elements from the interconnect structure which will be formed upon the substrate. This dielectric layer is known as premetal dielectric (PMD).

Figure 3A:
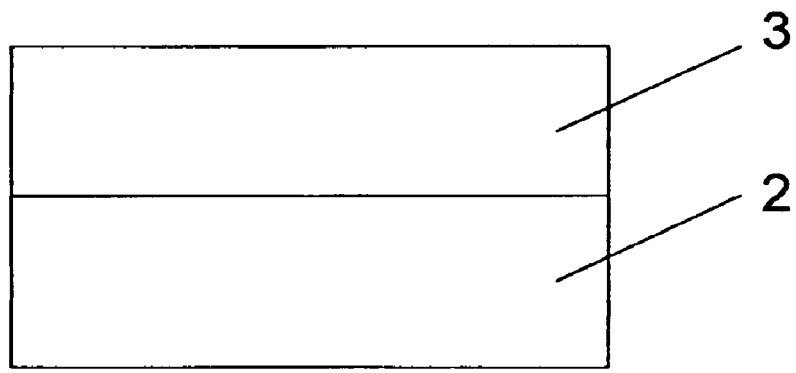

On this substrate 2 a first dielectric layer 3 is present as shown in FIG. 3a. Typically this dielectric layer 3 isolates the substrate 2 from the interconnect structure, in which case this dielectric layer 2 is known as premetal dielectric (PMD). The material of the dielectric layer 3 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating.

Figure 3B:
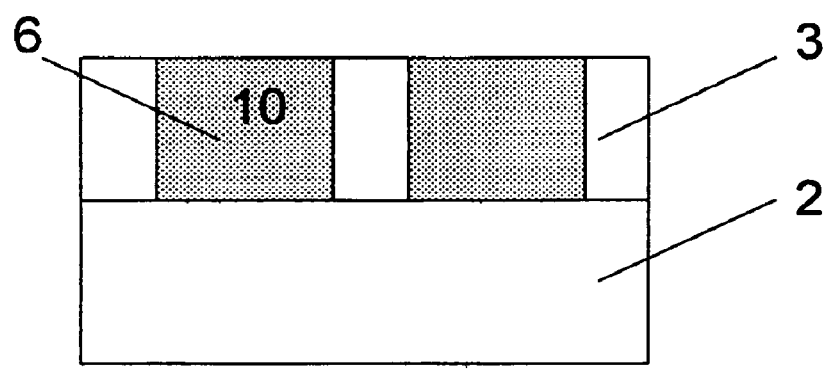

In this dielectric 3 a first metallic pattern 6 is formed as shown in FIG. 3b. Hereto trenches are etched in the dielectric layer 3 in accordance with the pattern and the dimensions of the metallic pattern 6 to be formed. A first metallic layer is deposited overlying the patterned dielectric layer 3. Typically a stack of metallic layers is deposited to at least fill the trenches formed in dielectric layer 3. The material of the metallic pattern 6 can be Cu, Al, W, WN, Ti, TiN, Ta and/or TaN.

Metal in excess of the metal in the filled trenches is removed, e.g. by polishing or etch-back. Typically the substrate 2 is polished such that any metal present outside the trench is removed. One can use e.g. chemical polishing (CP) or chemical-mechanical polishing (CMP). The thus formed metallic pattern 6 provides the bottom or first electrode 10 of the resistor element.

Figure 3C:
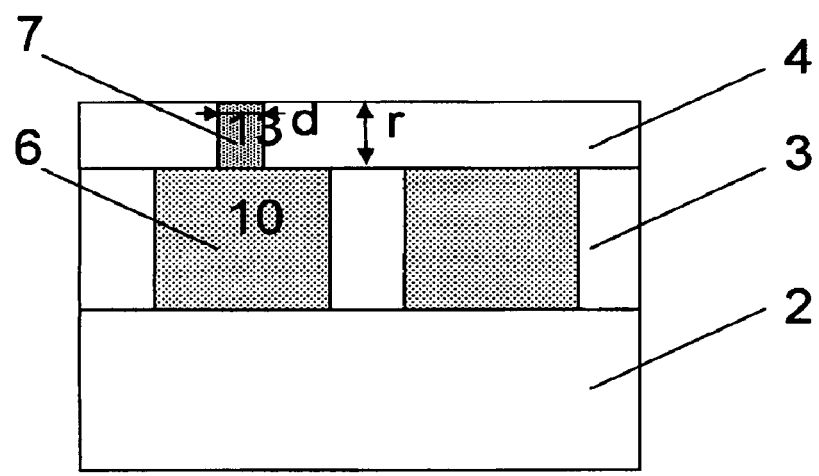

Overlying the first metallic pattern 6 a second dielectric layer 4 is formed as shown in FIG. 3c. In this dielectric layer 4 a recess 7 is created providing access to the first metallic pattern 6. This recess 7 has a height r and a width d. The height r of the recess 7 is determined by the thickness of the second dielectric layer or layer stack 4, while the width d is determined by the lithographic patterning step. The metal 13, selected as starting material for the formation of the resistive switching layer 11 to be formed in later steps, is provided in the recess 7. Preferably this metal is deposited over the substrate 2 and all metal in excess of the recess 7 is removed, e.g. by polishing or etch-back. Typically the substrate 2 is polished such that any metal present outside the recess 7 is removed. One can use e.g. chemical polishing (CP) or chemical-mechanical polishing (CMP). The thus formed metal recess 7 provides the metal 13 for forming the resistive switching layer 11. The metal 13 used to fill the recess 7 can be different than the metal used to form the metallic pattern 6.

Figure 3D:
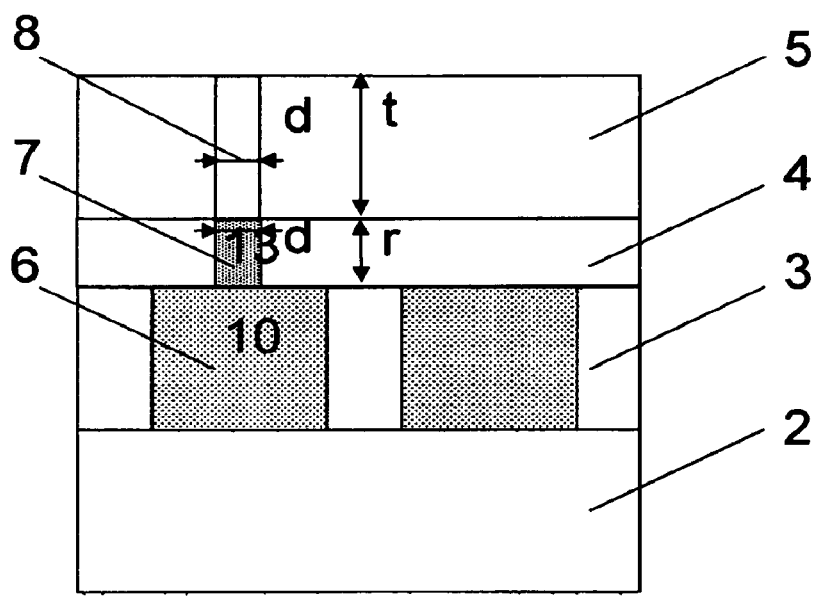

Overlying the first metallic pattern 6 a third dielectric layer 5 is formed as shown in FIG. 3d. This dielectric layer will have thickness t. Typically this third dielectric layer 5 comprises multiple dielectric layers. This second dielectric layer 5 further isolates metallic patterns 6, 9 present at subsequent levels, in which case this dielectric layer is known as intermetal dielectric (IMD). The material of the dielectric layer 5 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating. In this second dielectric layer 5 via's 8 are formed to expose the metal 13 in recess 7. Preferably the via's 8 are lithographically patterned using the same mask used to lithographically pattern the recesses 7. The trench 8 in the dielectric layer 5 adjacent to the recess 7 will constitute a container to which the later formed resistive switching material 11 is confined.

Figure 3E:
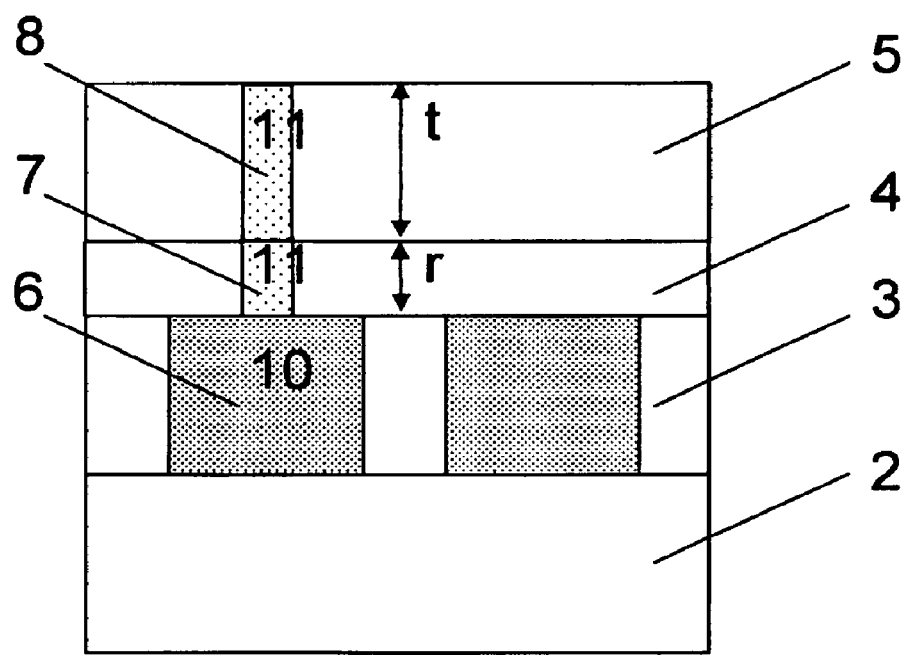

In the via 8 adjacent to the recess 7 a resistive switching material 11 is selectively formed as shown in FIG. 3e. The resistive switching material 11 will at least partially fill this trench 8 and the recess 7. The resistive switching material 11 is confined to the trench 8 and the recess 7 such that the resistive switching layer 11 doesn't extend beyond the trench 8. The thickness of the resistive switching layer 11 is thus equal to or less than the sum of height t of the trench 12, which height corresponds to the thickness t of the third dielectric layer 5, and the height r of the recess 7, which height corresponds to the thickness of the second dielectric layer 4. By limiting the amount of metal 13 available for the formation of the resistive switching layer 11 the volume of the resistive switching layer 11 can be controlled such that it is confined to the opening 7, 8 formed in the dielectric layer 4, 5 separating subsequent metal levels 6, 9 in the back-end-of-line of an integrated circuit. The metal 13 to be consumed during the resistive switching layer forming process is confined to the recess 7. Essentially no metal from the bottom electrode 10 will be consumed during this forming process.

The resistive switching layer 11 comprises a charge transfer complex containing an electron donor and an electron acceptor. The electron acceptor is formed by an organic compound having a pi electron system. Preferably the organic compound is provided by TCNQ or by a derivative of TCNQ. The electron donor is provided by metal 13. Preferably this metal is Cu, Ag or K. The material of the resistive switching layer 11 is selected from the group of organic materials and organometallic semiconductors: rotaxanes and catenanes, polyphenyleneethylenes, CuDDQ and AgDDQ wherein DDQ standing for 2,3-dichloro-5,6-dicyano-p-benzoquinone, CuTCNE and AgTCNE, wherein TCNE standing for tetracyanoethylene, CuTNAP and AgTNAP, wherein TNAP standing for tetracyanonaphtoquinodimethane, as well as AgTCNQ and CuTCNQ, wherein TCNQ standing for 7,7, 8,8-tetracyano-p-quinodimethane.

Methods for growing organic semiconductors are known in the art. For example in the case of TCNQ, grow methods are e.g. disclosed by R. S. Potember et al in "Electrical switching and memory phenomena in CuTCNQ thin films", Applied Physics Letter 34(6) March 1979, in particular the formation of CuTCNQ by a reaction between metallic copper and TCNQ dissolved in acetonitrile, U.S. Pat. No. 6,815,733 in particular the growth of CuTCNQ by thermal codeposition of Cu and TCNQ on an $Al_2O_3$ layer.

R. Müller et al in "Organic CuTCNQ non-volatile memories for integration in the CMOS backend-of-line: preparation from gas/solid reaction and downscaling to an area of 0.25 $um^2$", Proceedings of ESSDERC conference, Grenoble, France, p 216, in particular growth of CuTCNQ by corrosion of a Cu substrate by TCNQ vapor a reduced pressure, Z Fian et al in "Silver-tetracyanoquinodimethane (Ag-TCNQ) Nanostructures and Nanodevice" in IEEE Transactions on Nanotechnology, vol 4, no 2: 238-14, March 2005, the growth of AgTCNQ either by a reaction between Ag and TCNQ dissolved in acetonitrile or by a synthesis of Ag and TCNQ in a vapor atmosphere Alternatively a bistable resistive switching binary metal oxide 11 can be thermally grown on the exposed metal 13 of recess 7. The binary oxide can be a cuprous oxide $Cu_xO_y$ if copper 13 is used to the fill the recess 7. The binary metal oxide can be a transition metal binary oxide, such as titanium oxide, Depending on the metal exposed an oxide such as an alumina oxide, a tantalum oxide, a titanium oxide or a nickel oxide can be grown.

The thickness of the resistive switching layer 11 is thus equal to or less than the height of the trench 7, 8 which height corresponds to the sum of the thickness t of the second dielectric layer 5 and of the thickness r of the first dielectric layer 4. Per unit volume of available metal 13 about 20 times more volume of resistive switching material 11 will be formed during growth. For example if CuTCNQ is formed, the volume of CuTNCQ will be about 20 times the volume of the consumed copper 13. The ratio (volume of trench 8 to recess 7) is selected to substantially correspond to the ratio (volume of resistive switching material 11 formed to volume of metal 13) consumed. If the trench 8 and the recess 7 are lithographically patterned using the same mask, both cavities 7, 8 will have substantially the same cross-section area parallel to the substrate 2. The ratio (the thickness t of the second dielectric layer 5 to the thickness r of the first dielectric layer 4) will then be selected as function of the volume increase of the resistive switching layer 11 formed. In case of CuTCNQ the value of thickness t should be at least 20 times greater than the value of the thickness r.

The metal for forming the resistive switching layer 11 is thus provided by the metal contained in the recess 7. The amount of the metal available for forming the resistive switching layer 11 is function by the dimensions of this recess. Hence the amount of resistive switching layer 11 formed is limited by the dimensions of this recess 7 and not by the process parameters such as time and temperature. Hence the growth of the resistive switching layer 11 can be easier or better controlled by the selecting the geometry of the recess 7. Moreover as the metal 13 contained in recess 7 can be different from the metal used to form the metallic pattern 6, appropriate metals can be selected to fill the recess 7.

Figure 3F:
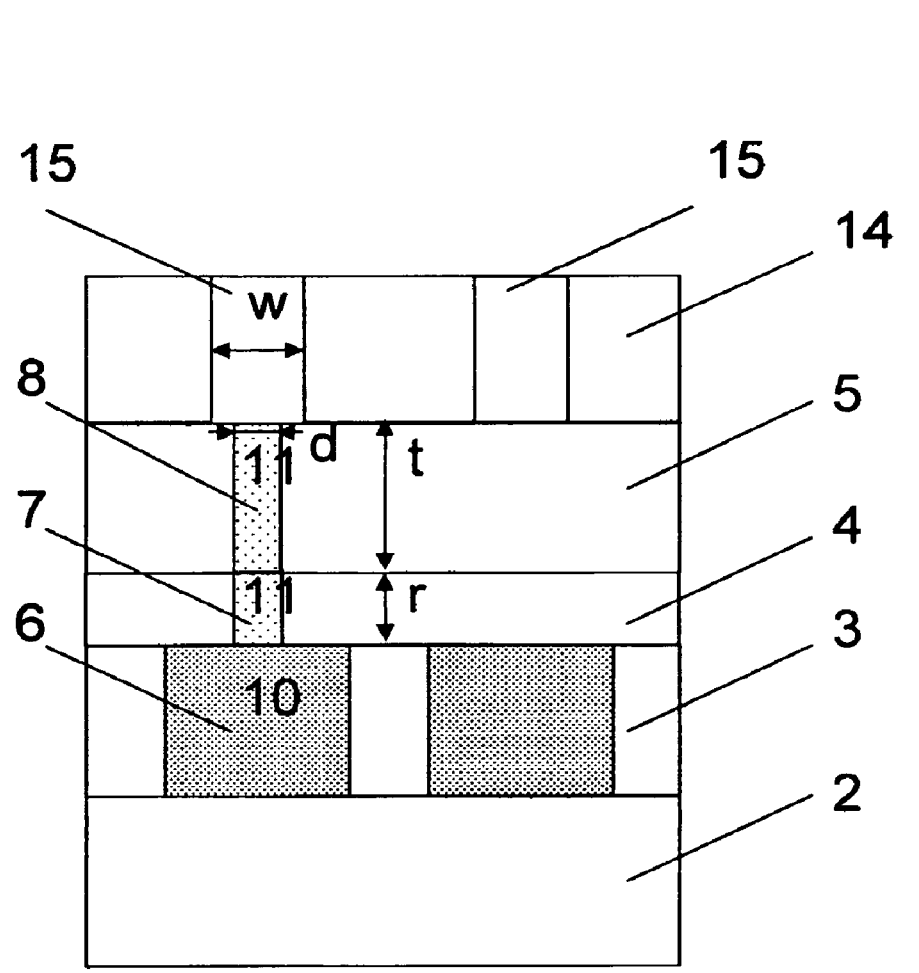

Overlying the third dielectric layer 5 a fourth dielectric layer 14 is formed as shown in FIG. 3f. This fourth dielectric layer 14 isolates elements of the metallic pattern 9 present at the same level. Typically a stack of dielectric layers 14 is deposited. The material of the dielectric layer 14 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating. In this dielectric layer 14 cavities 15 are formed in accordance with the pattern and the dimensions of the second metallic pattern 9 to be formed. The trench 15 can be aligned to the trench 8, in which case the diameter d of trench 8 is of substantially the same magnitude as the width w of the trench 15. For the purpose of teaching the invention the width w of the trench 15 is made larger than the diameter d of the trench 8 In the embodiment illustrated by FIG. 3f. Typically the trench 8 is made aligned to the trench 15 and the width w of trench 15 is substantially equal to the diameter d of the trench 8 such that the trench 15 doesn't or only slightly overlaps the trench 8.

The trenches 15 in the layer 14 overlying layer 5 will be filled with metal to form the second metallic pattern 9. If the trench 8 is not completely filled with the resistive switching material 11, then this second metallic layer will also fill the remainder of the trench 8. Typically a stack of metallic layers is deposited over the patterned dielectric 14. The material of the metallic pattern 9 can be Cu, Al, W, WN, Ti, TiN, Ta and/or TaN. Metal in excess of the metal in the filled trenches 15 is removed, e.g. by polishing or etch-back. Typically the substrate 2 is polished such that any metal present outside the trench is removed. One can use e.g. chemical polishing (CP) or chemical-mechanical polishing (CMP). The thus formed metallic pattern 9 provides the top or second electrode 12 of the resistor element as shown in FIG. 3g.

FIGS. 3a-g illustrates a process module for the fabrication of a resistor element according to embodiments of the invention, the resistor element comprising a bottom electrode 10, a resistive switching layer 11 and a top electrode 12. This process module is compatible with single damascene processing for fabrication of interconnect structures; in particular interconnect structures fabricated in the back-en-of-line part of semiconductor processing. The resistive switching layer 11 is essentially formed in the via 8 of a single damascene interconnect module whereby the resistive switching layer 11 at least partially fills the via 8. An advantage of this process module is that it is independent of other process modules in a process flow and hence can be inserted at various moments in the process flow.

FIGS. 4a-f illustrates by means of schematic cross-sections an alternative process flow for manufacturing the device 1 illustrated by FIG. 1.

A substrate 2 is provided. The substrate 2 can be any substrate on which such damascene stack can be formed. Examples of such a substrate are a glass or quartz substrate, a ceramic substrate, a semiconductor substrate such as a silicon substrate, a silicon-on-insulator substrate (SOI), a germanium substrate, a germanium-on-insulator substrate (GOI). Preferably this substrate 2 is a semiconductor substrate comprising active elements such as diodes, transistors such as field effect transistors or bipolar transistors. If the substrate 2 contains active elements 17, these active elements can be used to select individual resistor elements in an array of resistor elements. Typically an active element, such as a diode or a transistor is operatively linked to a resistor element such that, when in operation, only selected resistor elements are addressed. The selected resistor element is then operated, e.g. programmed, erased or read. If the substrate 2 contains active elements than a dielectric layer is formed overlying the substrate. This dielectric layer isolate the active elements from the interconnect structure which will be formed upon the substrate. This dielectric layer is known as premetal dielectric (PMD).

Figure 4A:
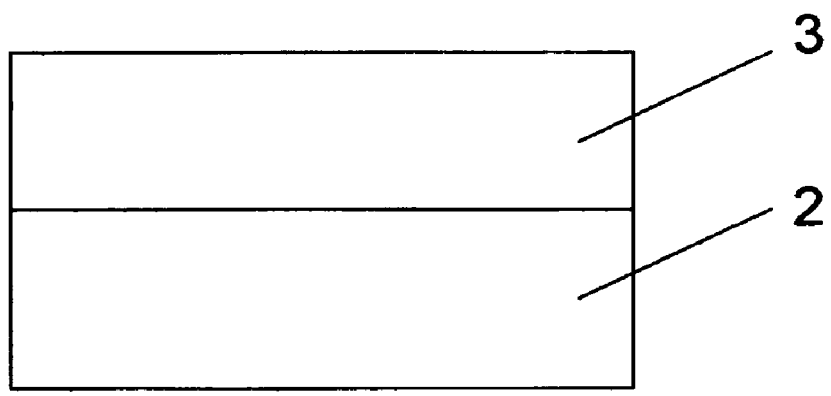
FIGS. 4a-f shows a schematic process flow for the fabrication of a resistive switching memory device according to an embodiment.

On this substrate 2 a first dielectric layer 3 is present as shown in FIG. 4a. Typically this dielectric layer 3 isolates the substrate 2 from the interconnect structure, in which case this dielectric layer 2 is known as premetal dielectric (PMD). The material of the dielectric layer 3 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating.

Figure 4B:
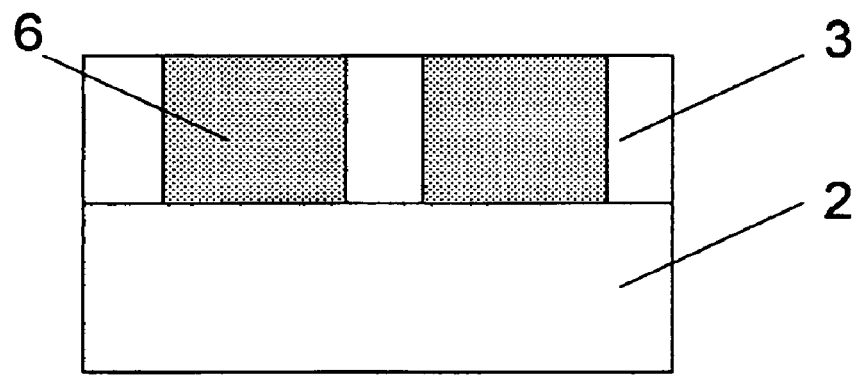

In this dielectric 3 a first metallic pattern 6 is formed as shown in FIG. 4b. Hereto trenches are etched in the dielectric layer 3 in accordance with the pattern and the dimensions of the metallic pattern 6 to be formed. A first metallic layer is deposited overlying the patterned dielectric layer 3. Typically a stack of metallic layers is deposited to at least fill the trenches formed in dielectric layer 3. The material of the metallic pattern 6 can be Cu, Al, W, WN, Ti, TiN, Ta, and/or TaN.

Metal in excess of the metal in the filled trenches is removed, e.g. by polishing or etch-back. Typically the substrate 2 is polished such that any metal present outside the trench is removed. One can use e.g. chemical polishing (CP) or chemical-mechanical polishing (CMP). The metallic pattern 6 provides a connection to the bottom electrode 10.

Figure 4C:
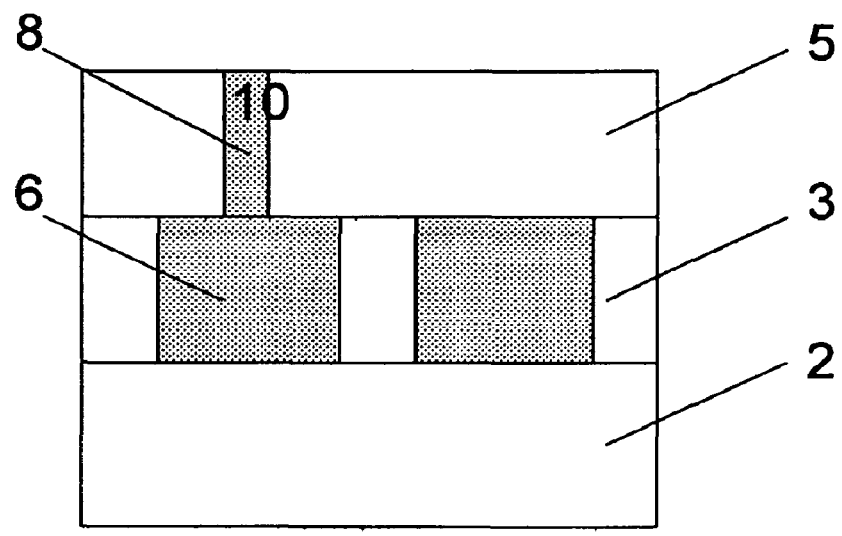

After providing a substrate comprising the metallic pattern 6 a via 8 is formed using a single damascene interconnect process module. Overlying the first metallic pattern 6 a second dielectric layer 5 is formed as shown in FIG. 4c. Typically this second dielectric layer 5 comprises multiple dielectric layers. This second dielectric layer 5 isolates metallic patterns 6, 9 present at subsequent levels, in which case this dielectric layer is known as intermetal dielectric (IMD). The material of the dielectric layer 5 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating. In this second dielectric layer 5 via's 8 are formed to expose the bottom electrodes 10.

The via's 8 in the dielectric layer 5 will be filled with metal to form an electrical connection towards the metallic pattern 6. The material used to fill the via 8 can be Cu, Al, W, WN, Ti, TiN, Ta, and/or TaN. Metal in excess of the metal in the filled trenches 8 is removed, e.g. by polishing or etch-back. Typically the substrate 2 is polished such that any metal present outside the trench is removed. One can use e.g. chemical polishing (CP) or chemical-mechanical polishing (CMP). The thus formed via pattern 8 provides the bottom or first electrode 10 of the resistor element as shown in FIG. 4c.

Figure 4D:
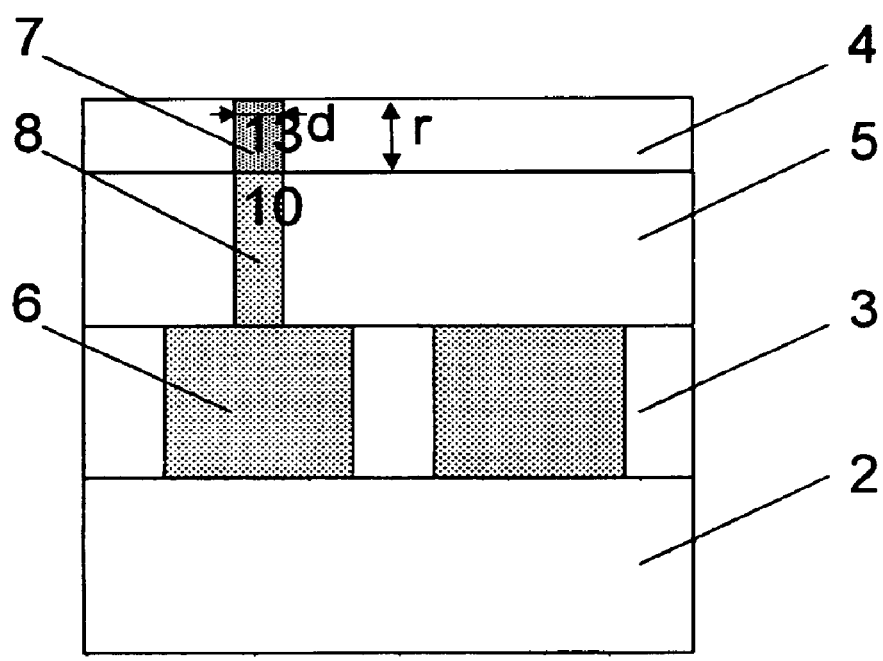

Overlying the dielectric 5 comprising the via's 8 a third dielectric layer 4 is formed as shown in FIG. 4d. In this dielectric layer 4 a recess 7 is created providing access to the via's 8. This recess 7 has a height r and a width d. The height r of the recess 7 is determined by the thickness of the second dielectric layer or layer stack 4, while the width d is determined by the lithographic patterning step. The metal 13, selected as starting material for the formation of the resistive switching layer 11 to be formed in later steps, is provided in the recess 7. Preferably this metal is deposited over the substrate 2 and all metal in excess of the recess 7 is removed, e.g. by polishing or etch-back. Typically the substrate 2 is polished such that any metal present outside the recess 7 is removed. One can use e.g. chemical polishing (CP) or chemical-mechanical polishing (CMP). The thus formed metal recess 7 provides the metal 13 for forming the resistive switching layer 11. The metal 12 used to fill the recess 13 can be different than the metal used to form the metallic pattern 6. Preferably the recess 7 is lithographically patterned using the same mask as is used to lithographic patterning the via's 8. Hence the recess 7 and the via 8 can be substantially aligned.

Figure 4E:
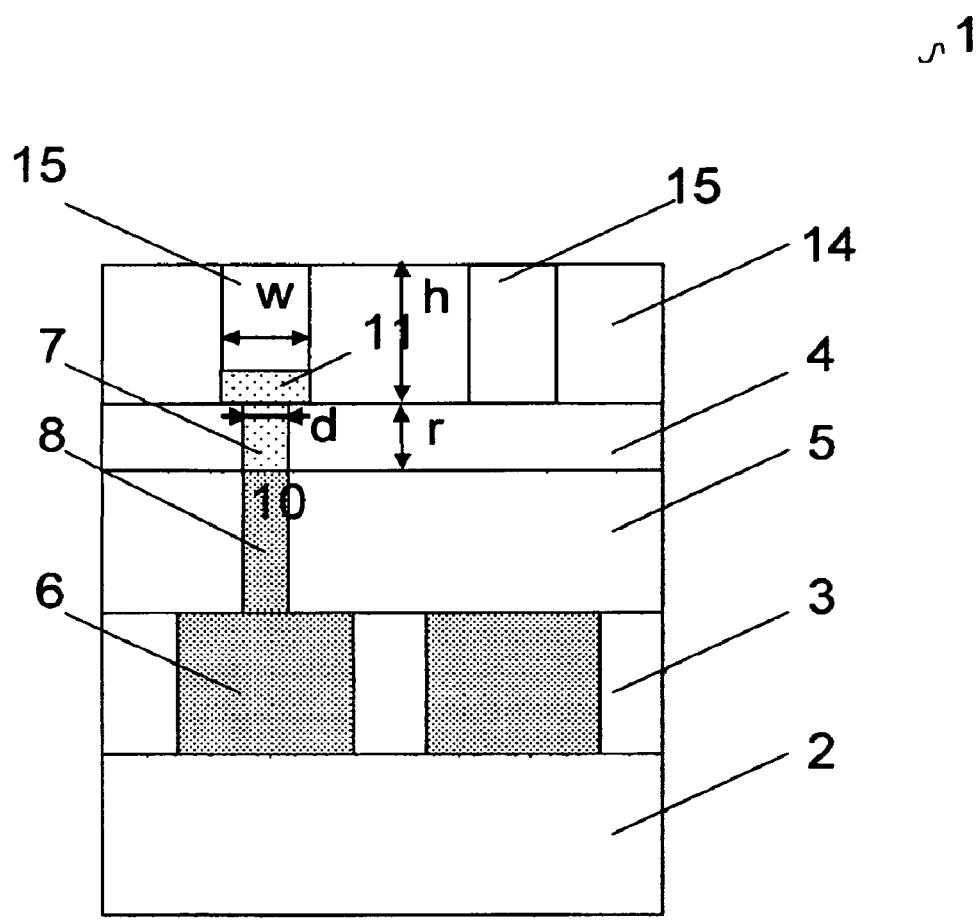

Overlying the third dielectric layer 4 a fourth dielectric layer 14 is formed as shown in FIG. 4e. This third dielectric layer 14 isolates elements of the metallic pattern 9 present at the same level. Typically a stack of dielectric layers 14 is deposited. The material of the dielectric layer 5 can be any dielectric used in semiconductor processing such as silicon oxide, silicon oxide carbide, low-k materials such as porous oxides, silicon nitride. They can be formed by deposition, e.g. chemical vapor deposition (CVD) or by coating, e.g. spin-coating. In this dielectric layer 14 trenches 15 are formed in accordance with the pattern and the dimensions of the second metallic pattern 9 to be formed. The trench 15 can be aligned to the trench 8, in which case the diameter d of trench 8 is of substantially the same magnitude as the width w of the trench 15. For the purpose of teaching the invention the width w of the trench 15 is made larger than the diameter d of the trench 8 In the embodiment illustrated by FIG. 4d. Typically the trench 8 is made aligned to the trench 15 and the width w of trench 15 is substantially equal to the diameter d of the trench 8 such that the trench 15 doesn't or only slightly overlaps the trench 8.

In the trench 15 a resistive switching material 13 is selectively formed on the material 13 filling the recess 7 as shown in FIG. 4g. The resistive switching material 11 will only partially fill this trench 15. The thickness of the resistive switching layer 11 is thus less than the height of the trench 15 which height corresponds to the thickness h of the fourth dielectric layer 14. A bistable resistive switching binary metal oxide 11, preferably a transition metal binary oxide, can be thermally grown on the exposed metal 13 of the recess 7. The binary oxide can be a cuprous oxide $Cu_xO_y$ if copper is used to the fill the recess 7. Depending on the metal 13 exposed an oxide such as an alumina oxide, a tantalum oxide, a titanium oxide or a nickel oxide can be grown. The thickness of the resistive switching layer 11 is thus less than the height of the trench 15 which height corresponds to the thickness h of the fourth dielectric layer 14. Per unit volume of available metal 13 about 20 times more volume of resistive switching material 11 will be formed during growth. For example if CuTCNQ is formed, the volume of CuTNCQ 11 will be about 20 times the volume of the consumed copper 13. The ratio (volume of trench 15 to recess 7) is selected to substantially correspond to the ratio (volume of resistive switching material 11 formed to volume of metal 13) consumed. If the width w of the trench 15 and the width d of the recess 7 are substantially the same, both cavities 8, 15 will have substantially the same cross-section area parallel to the substrate 2. The ratio (the thickness h of the fourth dielectric layer 14 to the thickness r of the third dielectric layer 4) will then be selected as function of the volume increase of the resistive switching layer 11 formed. In case of CuTCNQ the value of thickness h should be at least 20 times greater than the value of the thickness r. Or for a given single damascene process module with fixed layer thickness, the height r of the dielectric layer 4 in which the recess 7 is to be formed will be about 20 times less than the thickness of the h of the single damascene module if CuTCNQ is to be formed.

The resistive switching layer 11 comprises a charge transfer complex containing an electron donor and an electron acceptor. The electron donor is provided by metal 13. Methods for growing organic semiconductors are known in the art.

Figure 4F:
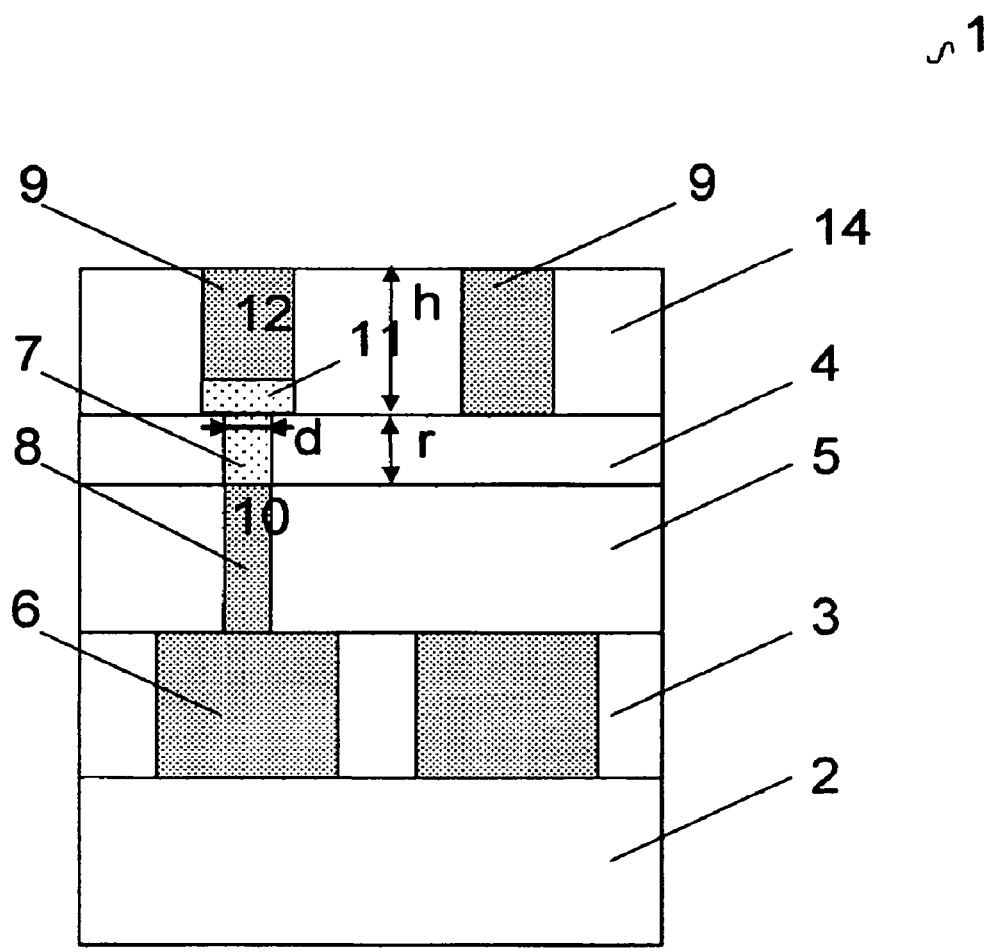

The trenches 15 in the layer 14 overlying layer 4 will be further filled with metal to form the second metallic pattern 9. The material of the metallic pattern 9 can be Cu, Al, W, WN, Ti, TiN, Ta and/or TaN. Metal in excess of the metal in the filled trenches 15 is removed, e.g. by polishing or etch-back. Typically the substrate 2 is polished such that any metal present outside the trench is removed. One can use e.g. chemical polishing (CP) or chemical-mechanical polishing (CMP). The thus formed metallic pattern 9 provides the top or second electrode 12 of the resistor element as shown in FIG. 4f.

FIGS. 4a-f illustrates a process module for the fabrication of a resistor element according to embodiments of the invention, the resistor element comprising a bottom electrode 10, a resistive switching layer 11 and a top electrode 12. This process module is compatible with damascene processing for fabrication of interconnect structures; in particular interconnect structures fabricated in the back-en-of-line part of semiconductor processing. The resistive switching layer 11 is formed in the trench 15 of a single damascene interconnect module whereby the resistive switching layer 11 only partially fills the trench 15. An advantage of this process module is that it is independent of other process modules in a process flow and hence can be inserted at various moments in the process flow.

Figure 5A:
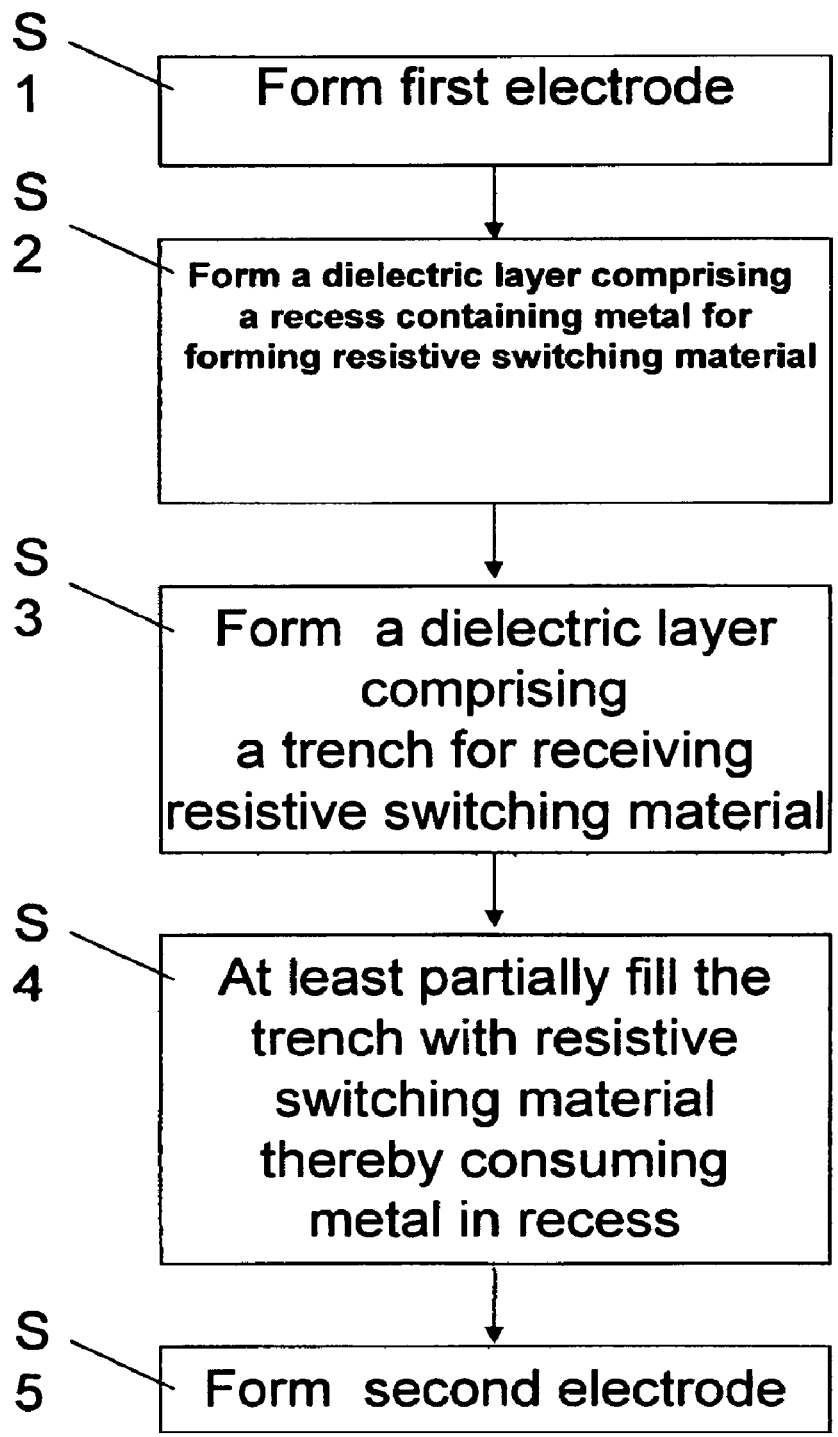
FIGS. 5a-c shows flowcharts schematically illustrating process flows for the fabrication of a resistor element according to embodiments of the invention.
Figure 5B:
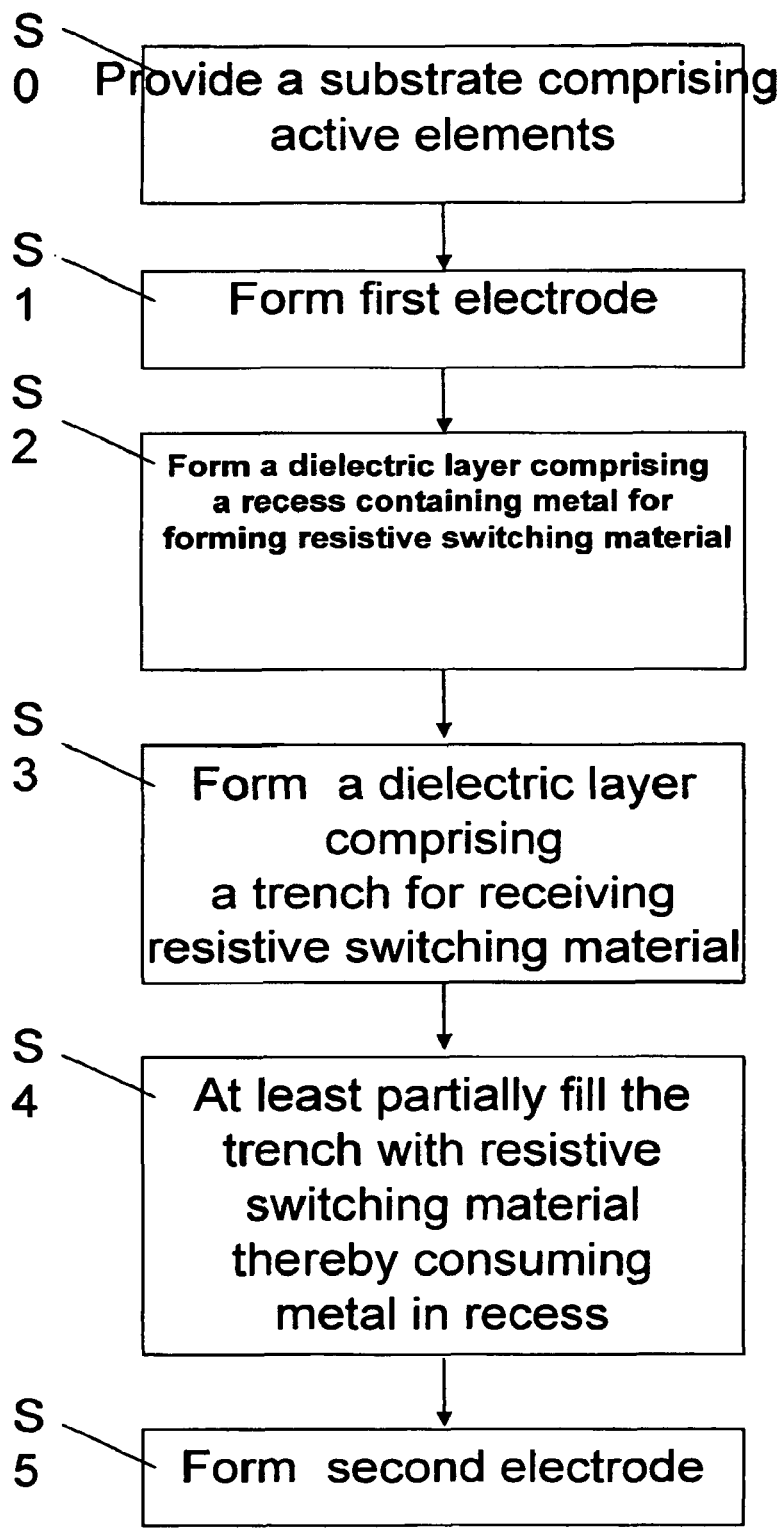
Figure 5C:
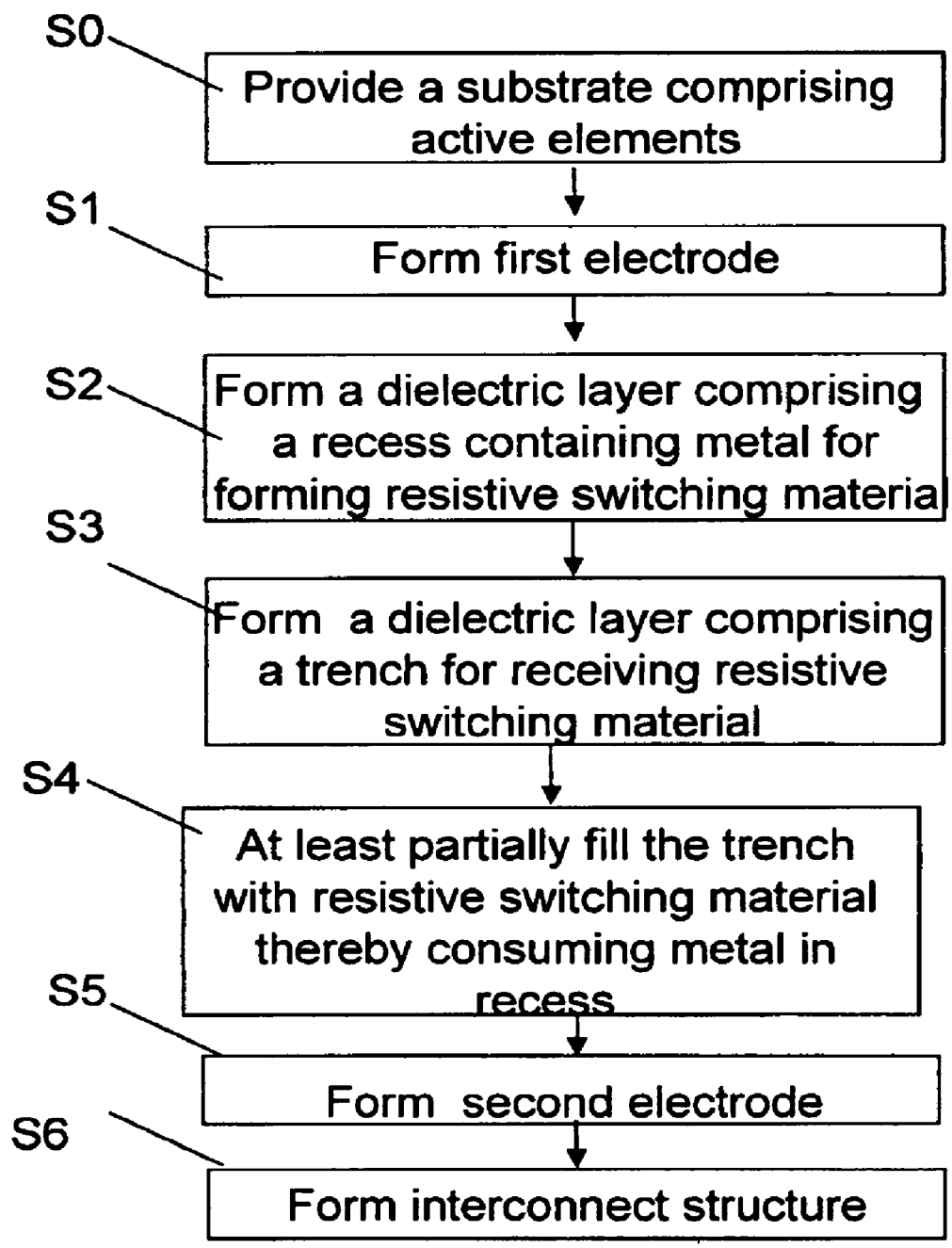

FIGS. 5a-c show flowcharts for fabricating a resistor element according to embodiments of the invention.

The flow chart of FIG. 5a illustrates a process module for the fabrication of a resistor element. The flow chart comprises the steps of forming S1 a first electrode 10 on a substrate 2, forming S2 a dielectric layer 4 overlying the first electrode 10 the dielectric comprising a recess 7 containing metal 13 for forming a resistive switching material 11, forming S3 a dielectric layer 5 overlying the layer 4 comprising the filled recess 7, the dielectric 5 comprising a trench 8 for receiving the resistive switching material 11, the trench 8 exposing the recess 7, at least partially filling S4 the trench 8 with resistive switching material 11 thereby contacting the first electrode 10 and forming S5 a second electrode 12 for contacting the resistive switching material 11.

The flow chart illustrated by FIG. 5b comprises the steps of providing S0 a substrate 2 comprising active elements 17 which will operatively linked with the resistor elements for addressing thereof, forming S1 a first electrode 10 the first electrode being in electrical contact with an active element 17, forming S2 a dielectric layer 4 overlying the first electrode 10 the dielectric comprising a recess 7 containing metal 13 for forming a resistive switching material 11, forming S3 a dielectric layer 5 overlying the layer 4 comprising the filled recess 7, the dielectric 5 comprising a trench 8 for receiving the resistive switching material 11, the trench 8 exposing the recess 7, at least partially filling S4 the trench 8 with resistive switching material 11 thereby contacting the first electrode 10 and forming S5 a second electrode 12 for contacting the resistive switching material 11.

The flow chart illustrated by FIG. 5c comprises the steps of providing comprises the steps of providing S0 a substrate 2 comprising active elements 17 which will operatively linked with the resistor elements for addressing thereof, forming S1 a first electrode 10 the first electrode being in electrical contact with an active element 17, forming S2 a dielectric layer 4 overlying the first electrode 10 the dielectric comprising a recess 7 containing metal 13 for forming a resistive switching material 11, forming S3 a dielectric layer 5 overlying the layer 4 comprising the filled recess 7, the dielectric 5 comprising a trench 8 for receiving the resistive switching material 11, the trench 8 exposing the recess 7, at least partially filling S4 the trench 8 with resistive switching material 11 thereby contacting the first electrode 10 and forming S5 a second electrode 12 for contacting the resistive switching material 11 and S6 forming an interconnect structure for addressing resistor elements.

The flow chart illustrated by FIG. 5d comprises the steps of forming S1 a first electrode 10 on a substrate, forming S2 a dielectric layer 4 overlying the first electrode 10, the dielectric 4 comprising a trench 12 for receiving the resistive switching material 9 the trench 12 exposing the first electrode 10, at least partially filing S3 the trench 12 with resistive switching material 9 thereby contacting the first electrode 10, forming S4 a second electrode 11 for contacting the resistive switching material 9 and forming S5 active elements which will be operatively linked with the second electrodes for addressing of resistor elements.

FIGS. 6a-g illustrate a preferred embodiment of the invention.

Figure 6A:
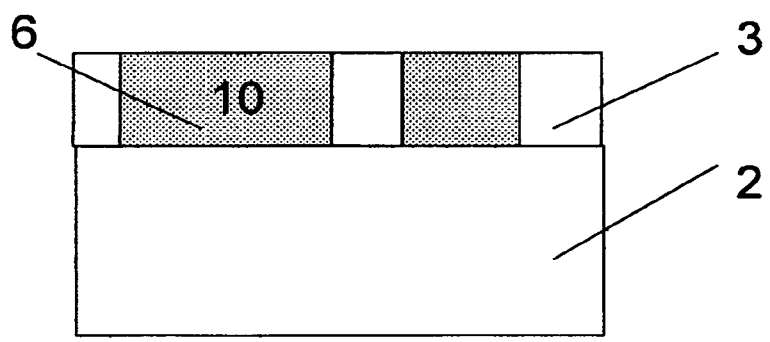
FIGS. 6a-g shows a schematic process flow for the fabrication of a device according to a preferred embodiment.

As shown in FIG. 6a a substrate 2 is provided. This substrate 2 is processed to form CMOS (Complementary Metal Oxide Silicon) devices and contacts. On this substrate a first metal pattern 6 is formed in a first dielectric layer 3. The first dielectric layer 3 is a stack of a silicon oxide layer and a silicon carbide layer. This dielectric layer 3 is photolithographically patterned to form trenches exposing the contacts (not shown in FIG. 6a). The pattern of the trenches corresponds to the pattern of the first metal pattern 6 to be formed. Then copper is deposited over the patterned dielectric layer 3, typically by first sputtering a thin layer of copper followed by electrochemical plating (ECP) copper until the trenches and the patterned dielectric layer is covered with copper. This copper layer is planarized thereby exposing the surface of the patterned dielectric layer 3 between the filled trenches thereby yielding the first metallic pattern 6. Planarization of the copper layer is typically done using chemical-mechanical polishing (CMP).

Figure 6B:
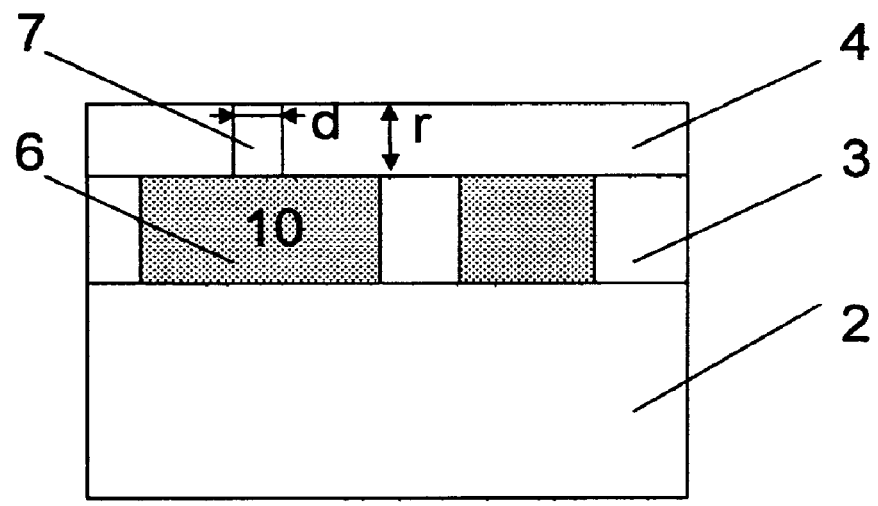
Figure 6C:
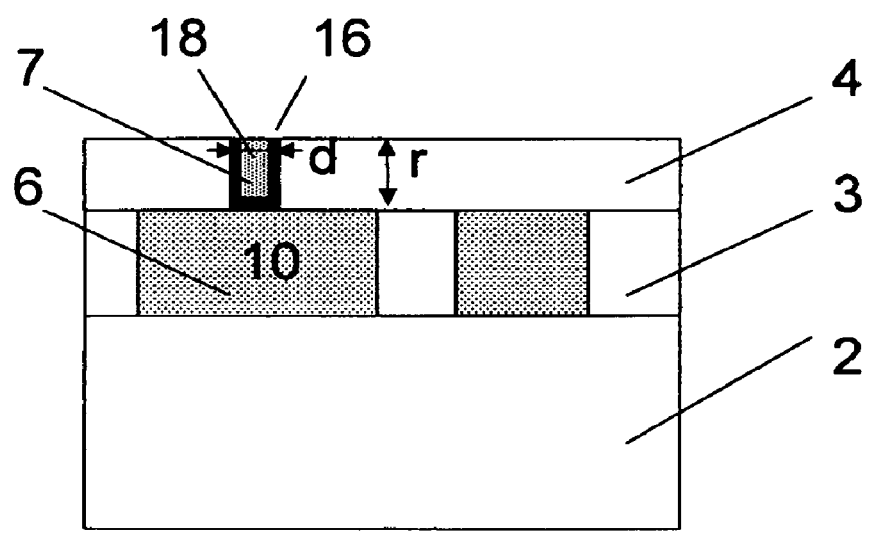

Then a second dielectric layer 4 is deposited over the patterned dielectric layer 3 containing the first metallic pattern 6 (METAL 1) as shown in FIG. 6b. Typically the second dielectric layer 4 is a siliconoxide or siliconcarbide layer, having a thickness r of about 50 nm. In this dielectric layer 4 a recess 7 is created providing access to the first metallic pattern 6. The recess 7 is created using lithographic patterning using the same mask (VIA1) as is used to outline the electrical connection between subsequent metal levels 6, 9. This recess 7 has a height r and a width d. The height r of the recess 7 is determined by the thickness of the second dielectric layer or layer stack 4, while the width d is determined by the lithographic patterning step. The metal 13, selected as starting material for the formation of the resistive switching layer 11 to be formed in later steps, is provided in the recess 7 as shown in FIG. 6c. Preferably this metal is deposited over the substrate 2 and all metal in excess of the recess 7 is removed, e.g. by polishing or etch-back. Typically the substrate 2 is polished such that any metal present outside the recess 7 is removed. One can use e.g. chemical polishing (CP) or chemical-mechanical polishing (CMP). The thus formed metal recess 7 provides the metal 13 for forming the resistive switching layer 11. The metal 13 used to fill the recess 7 can be different than the metal used to form the metallic pattern 6. Typically a stack of metal layers is deposited to fill the recess 7. This stack of metal layers can consist of a barrier layer 18 at least covering the sidewalls of the recess 7 and a bulk metal 16 for filling the recess 7. Typically 10 nm of Ta is deposited followed by the deposition of 15 nm of TaN. The Ta/TaN metal layer stack 18 will be used as barrier. Over this barrier stack about 180 nm of Cu 16 is deposited. The metal 18, 16 is chemical-mechanically polished until the dielectric layer 4 is exposed.

Figure 6D:
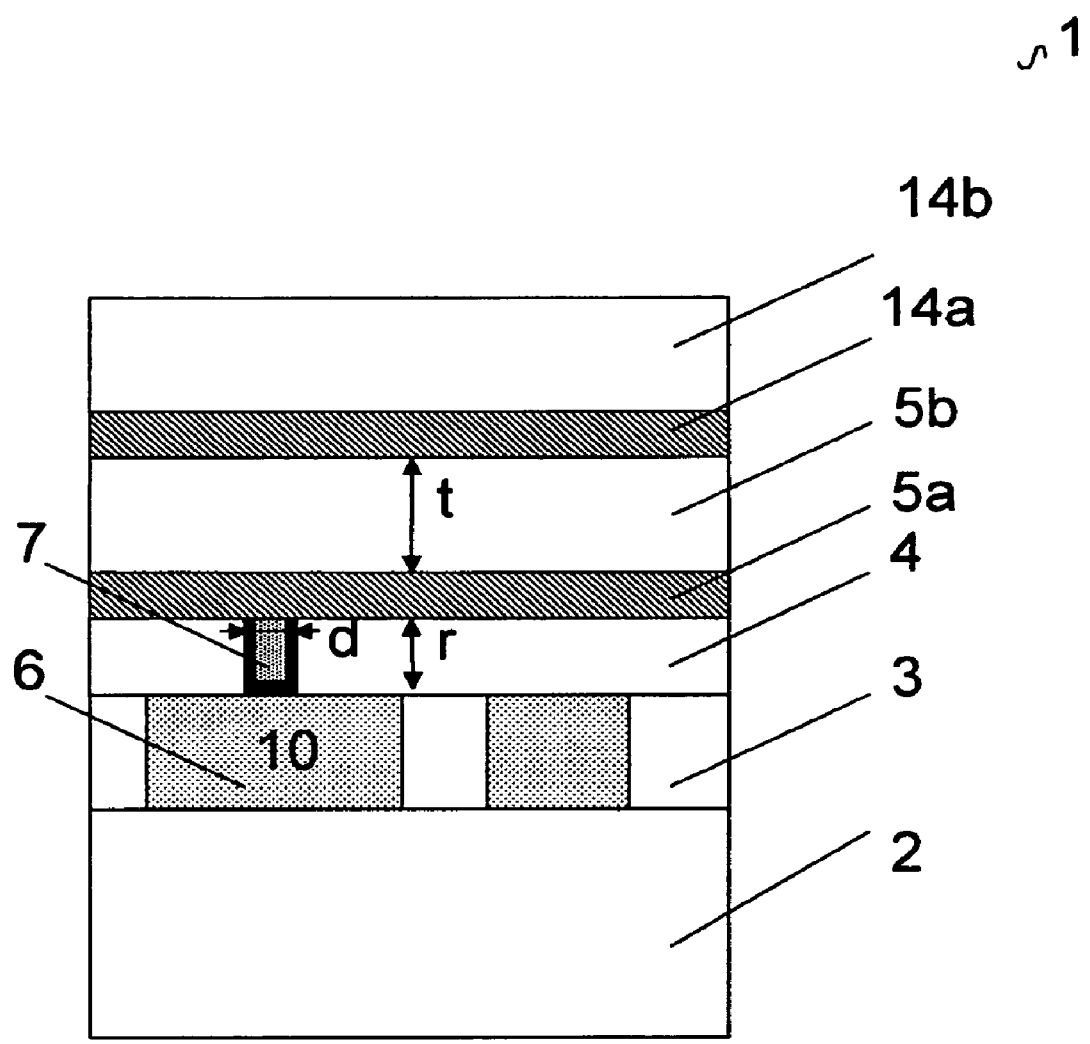

Then a third dielectric layer 5, 14 is deposited over the patterned dielectric layer 4 containing the filled recess 7 as shown in FIG. 6d. Typically the second dielectric layer 14, 5 is a stack of a silicon carbide layer 14a, 5a and a silicon oxide layer 14b, 5b.

Figure 6E:
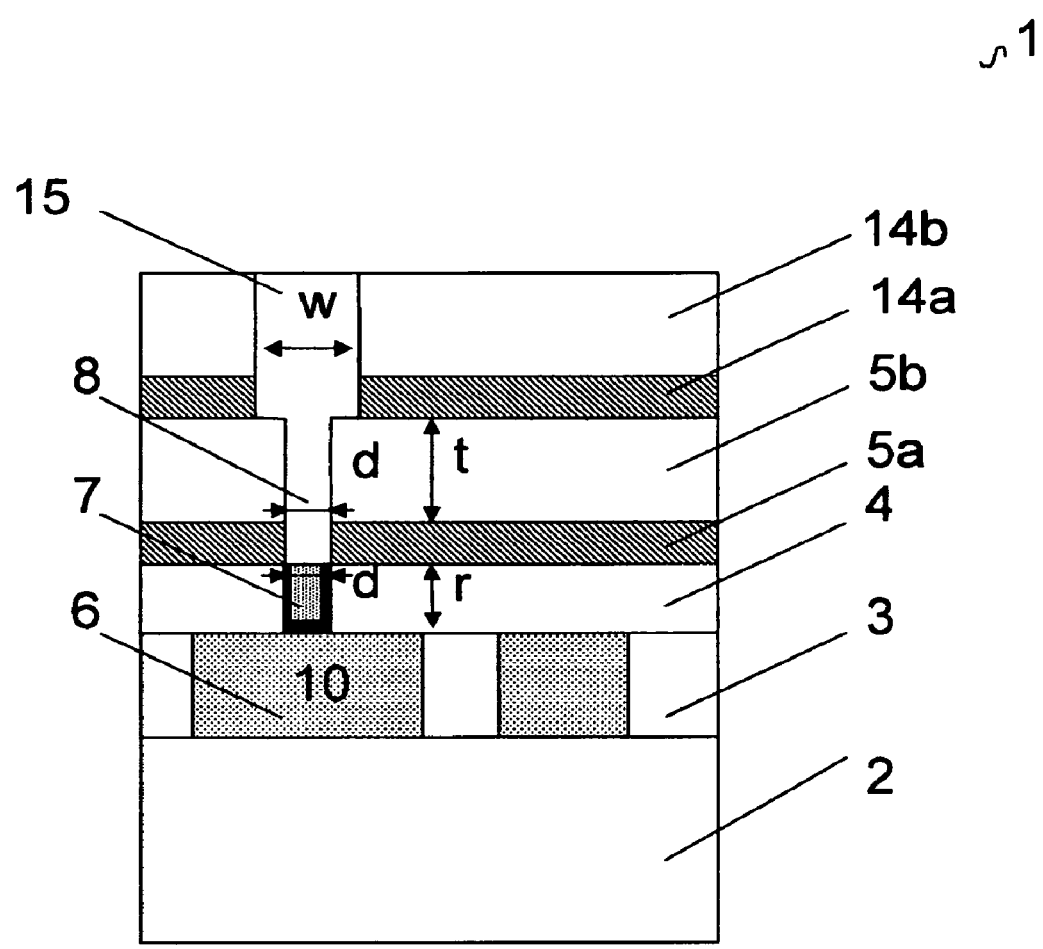

The second dielectric layer is patterned in two steps using the silicon-carbide layers 14a, 5a as etch stop layers as shown in FIG. 6e. Various approaches are known in the art and applicable to form trenches 8 for establishing an electrical contact between metallic patterns 6, 9 at subsequent levels and trenches 15 for forming another level of metallic pattern 9. In "Silicon Processing for the VLSI ERA", by Stanley Wolf, vol 4, 2004, p 674-679, hereby incorporated by reference, dual damascene interconnect technologies are being explained. One approach is to form in a first patterning step a trench in layer 14b thereby exposing layer 5b. This trench has a diameter d equal to the diameter of trench 8. In a second patterning step another trench 15 having width w is formed in the layer 14b. The pattern of the trenches 15 corresponds to the pattern of the second metal pattern 8 to be formed. When etching these trenches 15 the exposed layer 5b is further etched thereby forming the trench 8 in this layer 5b. Differences in etch time, e.g. due to differences in the thickness or in the composition 14b and 5b are dealt with by using layer 14a as an etch stop layer protecting the unexposed parts of layers 5b.

Figure 6F:
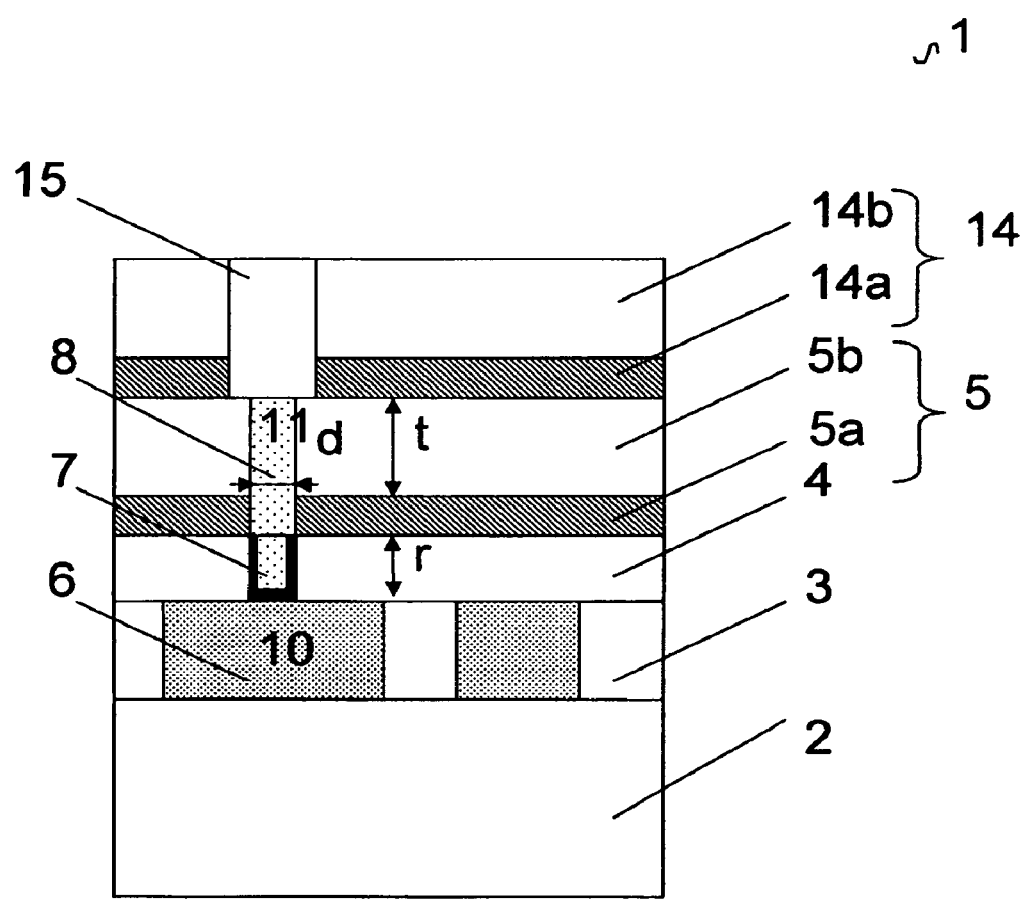

Inside the trench 8 the resistive switching layer 11 is formed as shown in FIG. 6f. For example CuTCNQ is grown from the bottom of the trench 8 where the metal 13 of the recess 7 is exposed. This growth process can be induced by a corrosion reaction of the exposed metallic copper surface of the metal 13 with TCNQ in vapor phase thereby generating CuTCNQ wires growing in a controlled way in the trench 8 thereby at least partially filling the trench 8. The CuTCNQ wires are confined to the trench 8 such that the resistive switching layer 11 doesn't extend beyond the trench 8. The thickness of the resistive switching layer 11 is thus equal to or less than the height of the trench 8 which height corresponds to the thickness t of the second dielectric layer 5. As the height of the recess 7 is about 50 nm and the thickness of the barrier layer 18 is about (10+15)=25 nm, a layer of 20 nm thick cupper will remain in the recess 7 after polishing. Given the characteristics of the CuTNCQ growth about 400 nm long CuTNCQ wires will be formed. Hence the height of the via 8 should be about 400 nm in order to completely contain the CuTNCQ resistive switching layer 11.

Figure 6G:
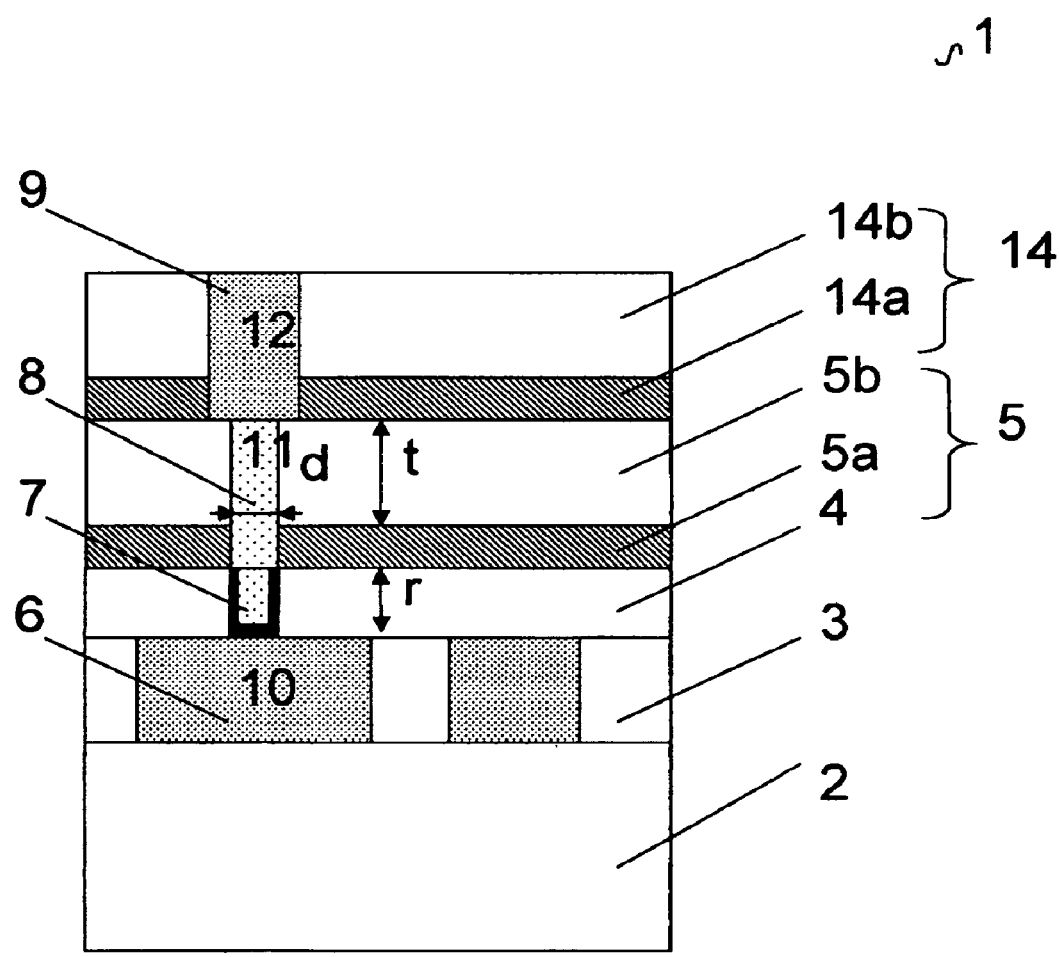

A top electrode contact 12 is formed as part of a second metallic pattern 9 as shown in FIG. 6g. Copper is deposited over the patterned dielectric layer 14, typically by first sputtering a thin layer of copper followed by electrochemical plating (ECP) copper until the trenches and the patterned dielectric layer is covered with copper. This copper layer is planarized thereby exposing the surface of the patterned dielectric layer 14 between the filled trenches 15 thereby yielding the second metallic pattern 9. Planarization of the copper layer is typically done using chemical-mechanical polishing (CMP).

A single resistor element or an array of resistor elements according to embodiments of the invention can be formed.

FIG. 7 illustrates a resistive switching memory device 1 formed using damascene processing according to embodiments wherein the resistive switching material is confined in a trench. The memory device 1 is selectable by a transistor 17 which is connected in series with the memory device 1.

Figure 8:
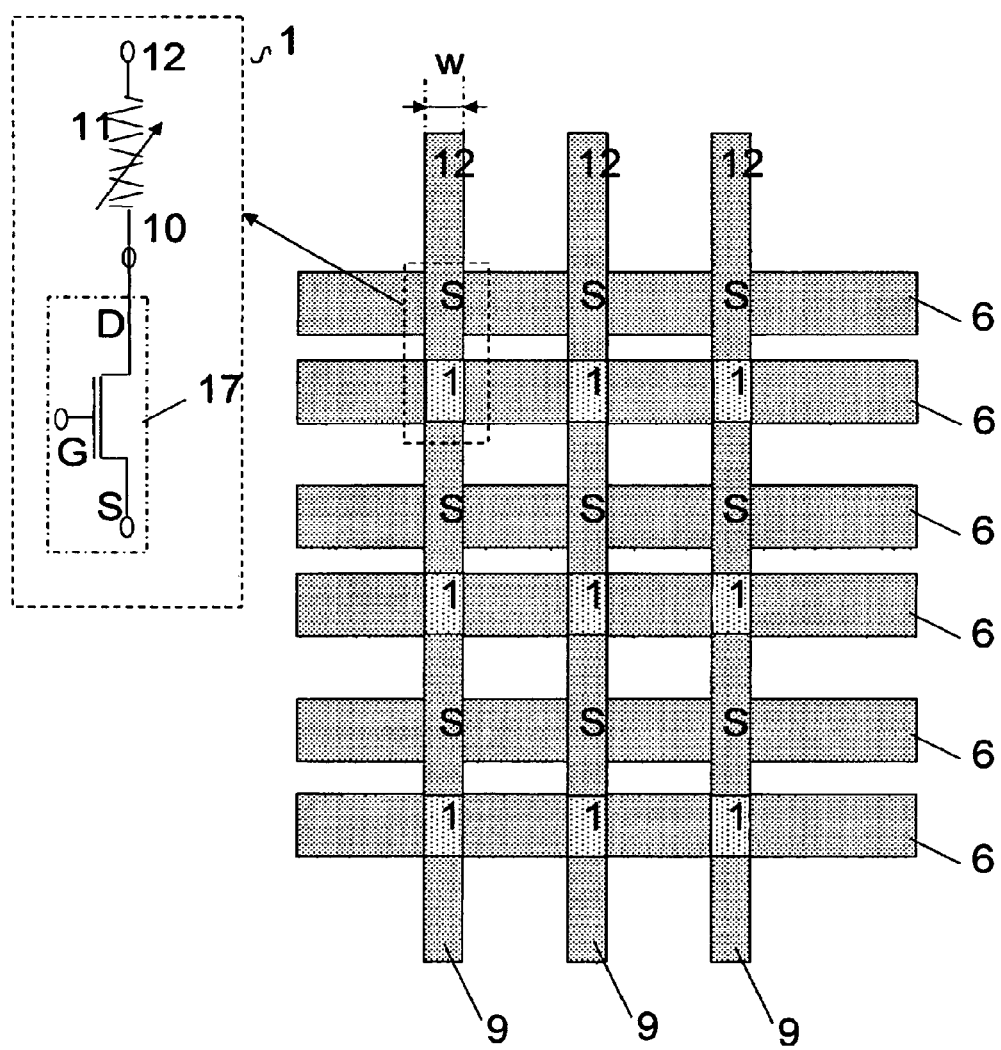
FIG. 8 illustrative an array of resistive switching memory device according to the embodiment illustrated by FIG. 7.

FIG. 8 shows an example of such an array of memory devices 1 according to any of the embodiments of the invention in the configuration illustrated by FIG. 7. The memory array is configured as a cross-point structure. Metal lines of a first metal pattern 6 run perpendicular to metal lines of a second metal pattern 9. As these metal patterns 6, 9 are formed at different levels the corresponding metal lines will cross each-other. At the cross-point a series connection is formed of the resistor element 10-11-12 and the selection element 17 between the two metal patterns. The teaching of the above embodiments can be used to form such a cross-point array.

The invention claimed is:

1. A method for manufacturing a resistive switching device, comprising:
    providing a substrate comprising a first electrode;
    forming on the substrate a first dielectric layer;
    etching the first dielectric layer to form a first trench;
    depositing in the first trench a first metal;
    forming on the first dielectric layer a second dielectric layer;
    etching the second dielectric layer to form a second trench exposing at least a portion of the first metal; and
    forming from the first metal and not from the first electrode a resistive switching material in at least a portion of the first trench and at least a portion of the second trench.

2. The method of claim 1, wherein forming the resistive switching material comprises forming from a volume of the first metal a volume of the resistive switching material, wherein the volume of the resistive switching material is related to the volume of the first metal by a predefined volume expansion coefficient.

3. The method of claim 2, further comprising:
    selecting a volume of the first trench and a volume of the second trench based at least in part on the volume of the first metal and the predefined volume expansion coefficient.

4. The method of claim 1, further comprising:
    forming on the second dielectric layer a third dielectric layer;
    etching the third dielectric layer to form a third trench; and
    forming a second electrode in at least the third trench.

5. The method of claim 4, wherein forming the resistive switching material in at least a portion of the second trench comprises forming the resistive switching material in substantially all of the second trench.

6. The method of claim 1, wherein providing the substrate comprising the first electrode comprises:
    forming on the substrate a substrate-dielectric layer;
    etching the substrate-dielectric layer to form a substrate-trench; and
    depositing in the substrate-trench an electrode metal, thereby forming a first metal pattern comprising the first electrode.

7. The method of claim 1, wherein the resistive switching material comprises a charge transfer complex comprising an electron donor and an electron acceptor.

8. The method of claim 7, wherein the resistive switching material is an organic compound having a pi electron system.

9. The method of claim 8, wherein the organic compound is provided by tetracyanoquinodimethane (TCNQ) or by a derivative of TCNQ.

10. The method of claim 9, wherein the electron donor is provided by the first metal, wherein the first metal is selected from the group consisting of copper, silver, and potassium.

11. The method of claim 1, wherein the resistive switching material is a binary metal oxide.

12. The method of claim 11, wherein the first electrode comprises copper, and the binary metal oxide is a cuprous metal oxide.

13. The method of claim 1, wherein the first electrode comprises an electrode metal that differs from the first metal.

14. The method of claim 1, wherein the resistive switching device is a non-volatile memory device.

15. The method of claim 4, wherein the first electrode is in electrical contact with the second electrode via the resistive switching material.

16. The method of claim 4, wherein forming the second electrode in the third trench comprises:
    depositing a third metal; and
    removing at least a portion of any of the third metal outside the third trench.

17. The method of claim 1, further comprising:
    prior to depositing the first metal, forming in the first trench a barrier layer.

* * * * *